(12) United States Patent
Kato et al.

(10) Patent No.: US 8,544,754 B2
(45) Date of Patent: Oct. 1, 2013

(54) WIRELESS IC DEVICE AND WIRELESS IC DEVICE COMPOSITE COMPONENT

(75) Inventors: Noboru Kato, Moriyama (JP); Yuya Dokai, Nagaokakyo (JP); Satoshi Ishino, Kusatsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 822 days.

(21) Appl. No.: 12/276,444

(22) Filed: Nov. 24, 2008

(65) Prior Publication Data

US 2009/0065594 A1 Mar. 12, 2009

Related U.S. Application Data

(63) Continuation of application No. PCT/JP2007/060034, filed on May 16, 2007.

(30) Foreign Application Priority Data

Jun. 1, 2006 (JP) .................................. 2006-153703
Sep. 1, 2006 (JP) .................................. 2006-238372

(51) Int. Cl.
*G06K 19/06* (2006.01)

(52) U.S. Cl.
USPC ........................................................ 235/492

(58) Field of Classification Search
USPC ........................................................ 235/492
See application file for complete search history.

(56) References Cited

U.S. PATENT DOCUMENTS

| | | | |
|---|---|---|---|
| 3,364,564 A | 1/1968 | Kurtz et al. |
| 4,794,397 A | 12/1988 | Ohe et al. |
| 5,232,765 A | 8/1993 | Yano et al. |
| 5,253,969 A | 10/1993 | Richert |
| 5,337,063 A | 8/1994 | Takahira |
| 5,374,937 A | 12/1994 | Tsunekawa et al. |
| 5,399,060 A | 3/1995 | Richert |
| 5,491,483 A | 2/1996 | D'Hont |
| 5,757,074 A | 5/1998 | Matloubian et al. |
| 5,903,239 A | 5/1999 | Takahashi et al. |
| 5,936,150 A | 8/1999 | Kobrin et al. |
| 5,955,723 A | 9/1999 | Reiner |
| 5,995,006 A | 11/1999 | Walsh |

(Continued)

FOREIGN PATENT DOCUMENTS

| EP | 0 942 441 A2 | 9/1999 |
|---|---|---|
| EP | 0 977 145 A2 | 2/2000 |

(Continued)

OTHER PUBLICATIONS

Official communication issued in Japanese Application No. 2007-531524, mailed on Sep. 11, 2007.

(Continued)

*Primary Examiner* — Daniel Hess
*Assistant Examiner* — David Tardif
(74) *Attorney, Agent, or Firm* — Keating & Bennett, LLP

(57) ABSTRACT

A wireless IC device includes a wireless IC chip, a feed circuit board having the wireless IC chip mounted thereon and including a feed circuit including inductance elements, and a radiation plate electromagnetically coupled to the inductance elements in the feed circuit. A high-permeability magnetic body made of a high-permeability magnetic material is provided in the feed circuit board and a portion of the inductance elements is provided in the high-permeability magnetic body.

15 Claims, 20 Drawing Sheets

(56) References Cited

U.S. PATENT DOCUMENTS

| | | |
|---|---|---|
| 6,104,311 A | 8/2000 | Lastinger |
| 6,107,920 A | 8/2000 | Eberhardt et al. |
| 6,172,608 B1 | 1/2001 | Cole |
| 6,181,287 B1 | 1/2001 | Beigel |
| 6,190,942 B1 | 2/2001 | Wilm et al. |
| 6,259,369 B1 | 7/2001 | Monico |
| 6,271,803 B1 | 8/2001 | Watanabe et al. |
| 6,335,686 B1 | 1/2002 | Goff et al. |
| 6,362,784 B1 | 3/2002 | Kane et al. |
| 6,367,143 B1 | 4/2002 | Sugimura |
| 6,378,774 B1 | 4/2002 | Emori et al. |
| 6,406,990 B1 | 6/2002 | Kawai |
| 6,448,874 B1 | 9/2002 | Shiino et al. |
| 6,462,716 B1 | 10/2002 | Kushihi |
| 6,542,050 B1 | 4/2003 | Arai et al. |
| 6,600,459 B2 | 7/2003 | Yokoshima et al. |
| 6,634,564 B2 | 10/2003 | Kuramochi |
| 6,664,645 B2 | 12/2003 | Kawai |
| 6,763,254 B2 | 7/2004 | Nishikawa |
| 6,828,881 B2 | 12/2004 | Mizutani et al. |
| 6,927,738 B2 | 8/2005 | Senba et al. |
| 6,963,729 B2 | 11/2005 | Uozumi |
| 7,088,307 B2 | 8/2006 | Imaizumi |
| 7,112,952 B2 | 9/2006 | Arai et al. |
| 7,119,693 B1* | 10/2006 | Devilbiss ................ 340/572.5 |
| 7,129,834 B2 | 10/2006 | Naruse et al. |
| 7,248,221 B2 | 7/2007 | Kai et al. |
| 7,250,910 B2 | 7/2007 | Yoshikawa et al. |
| 7,276,929 B2 | 10/2007 | Arai et al. |
| 7,317,396 B2 | 1/2008 | Ujino |
| 7,405,664 B2 | 7/2008 | Sakama et al. |
| 7,515,111 B2* | 4/2009 | Tsujimura et al. .......... 343/787 |
| 7,924,235 B2* | 4/2011 | Fujimoto et al. ........... 343/787 |
| 2002/0011967 A1 | 1/2002 | Goff et al. |
| 2002/0044092 A1 | 4/2002 | Kushihi |
| 2002/0067316 A1 | 6/2002 | Yokoshima et al. |
| 2004/0001027 A1 | 1/2004 | Killen et al. |
| 2004/0207557 A1* | 10/2004 | Chen et al. ................. 343/702 |
| 2004/0217915 A1 | 11/2004 | Imaizumi |
| 2004/0219956 A1 | 11/2004 | Iwai et al. |
| 2004/0227673 A1 | 11/2004 | Iwai et al. |
| 2005/0092836 A1 | 5/2005 | Kudo |
| 2005/0099337 A1* | 5/2005 | Takei et al. ............ 343/700 MS |
| 2005/0125093 A1 | 6/2005 | Kikuchi et al. |
| 2005/0140512 A1 | 6/2005 | Sakama et al. |
| 2005/0232412 A1 | 10/2005 | Ichihara et al. |
| 2005/0236623 A1 | 10/2005 | Takechi et al. |
| 2005/0275539 A1 | 12/2005 | Sakama et al. |
| 2006/0001138 A1 | 1/2006 | Sakama et al. |
| 2006/0043198 A1 | 3/2006 | Forster |
| 2006/0044769 A1 | 3/2006 | Forster et al. |
| 2006/0055601 A1 | 3/2006 | Kameda et al. |
| 2006/0061511 A1 | 3/2006 | Enoki et al. |
| 2006/0071084 A1 | 4/2006 | Detig et al. |
| 2006/0109185 A1 | 5/2006 | Iwai et al. |
| 2006/0158380 A1 | 7/2006 | Son et al. |
| 2006/0267138 A1 | 11/2006 | Kobayashi |
| 2007/0004028 A1 | 1/2007 | Lair et al. |
| 2007/0018893 A1 | 1/2007 | Kai et al. |
| 2007/0040028 A1 | 2/2007 | Kawamata |
| 2007/0040688 A1* | 2/2007 | Cocita et al. ............... 340/572.7 |
| 2007/0052613 A1 | 3/2007 | Gallschuetz et al. |
| 2007/0252700 A1 | 11/2007 | Ishihara et al. |
| 2007/0285335 A1* | 12/2007 | Bungo et al. ................ 343/895 |
| 2008/0024156 A1 | 1/2008 | Arai et al. |
| 2008/0169905 A1 | 7/2008 | Slatter |
| 2008/0272885 A1 | 11/2008 | Atherton |
| 2009/0002130 A1 | 1/2009 | Kato |

FOREIGN PATENT DOCUMENTS

| | | |
|---|---|---|
| EP | 1 031 939 A1 | 8/2000 |
| JP | 50-143451 A | 11/1975 |
| JP | 62-127140 U | 8/1987 |
| JP | 05-327331 A | 12/1993 |
| JP | 6-53733 A | 2/1994 |
| JP | 06-077729 A | 3/1994 |
| JP | 06-177635 A | 6/1994 |
| JP | 07-183836 A | 7/1995 |
| JP | 08-056113 A | 2/1996 |
| JP | 8-87580 A | 4/1996 |
| JP | 08-087580 A | 4/1996 |
| JP | 11-149537 A | 6/1996 |
| JP | 08-279027 A | 10/1996 |
| JP | 08-307126 A | 11/1996 |
| JP | 08-330372 A | 12/1996 |
| JP | 09-014150 A | 1/1997 |
| JP | 09-245381 A | 9/1997 |
| JP | 09-252217 A | 9/1997 |
| JP | 09-270623 A | 10/1997 |
| JP | 10-69533 A | 3/1998 |
| JP | 10-505466 A | 5/1998 |
| JP | 10-171954 A | 6/1998 |
| JP | 10-293828 A | 11/1998 |
| JP | 11-149538 A | 6/1999 |
| JP | 11-219420 A | 8/1999 |
| JP | 11-261325 A | 9/1999 |
| JP | 11-328352 A | 11/1999 |
| JP | 11-346114 A | 12/1999 |
| JP | 11-515094 A | 12/1999 |
| JP | 2000-21128 A | 1/2000 |
| JP | 2000-021639 A | 1/2000 |
| JP | 2000-022421 A | 1/2000 |
| JP | 2005-229474 A | 1/2000 |
| JP | 2000-059260 A | 2/2000 |
| JP | 2000-085283 A | 3/2000 |
| JP | 2000-132643 A | 5/2000 |
| JP | 2000-137778 A | 5/2000 |
| JP | 2000-148948 A | 5/2000 |
| JP | 2000-172812 A | 6/2000 |
| JP | 2000-510271 A | 8/2000 |
| JP | 2000-276569 A | 10/2000 |
| JP | 2000-286634 A | 10/2000 |
| JP | 2000-286760 A | 10/2000 |
| JP | 2000-311226 A | 11/2000 |
| JP | 2000-321984 A | 11/2000 |
| JP | 2001-028036 A | 1/2001 |
| JP | 2007-18067 A | 1/2001 |
| JP | 2001-66990 A | 3/2001 |
| JP | 2001-101371 A | 4/2001 |
| JP | 2001-168628 A | 6/2001 |
| JP | 2001-256457 A | 9/2001 |
| JP | 2001-514777 A | 9/2001 |
| JP | 2001-319380 A | 11/2001 |
| JP | 2001-331976 A | 11/2001 |
| JP | 2001-332923 A | 11/2001 |
| JP | 2001-344574 A | 12/2001 |
| JP | 2001-351084 A | 12/2001 |
| JP | 2002-024776 A | 1/2002 |
| JP | 2002-042076 A | 2/2002 |
| JP | 2002-505645 A | 2/2002 |
| JP | 2002-76750 A | 3/2002 |
| JP | 2002-150245 A | 5/2002 |
| JP | 2002-175508 A | 6/2002 |
| JP | 2002-183690 A | 6/2002 |
| JP | 2002-185358 A | 6/2002 |
| JP | 2002-204117 A | 7/2002 |
| JP | 2002-230128 A | 8/2002 |
| JP | 2002-298109 A | 10/2002 |
| JP | 2002-319008 A | 10/2002 |
| JP | 2002-362613 A | 12/2002 |
| JP | 2002-368525 A | 12/2002 |
| JP | 2002-373029 A | 12/2002 |
| JP | 2002-373323 A | 12/2002 |
| JP | 2003-016412 A | 1/2003 |
| JP | 2003-030612 A | 1/2003 |
| JP | 2003-44789 A | 2/2003 |
| JP | 2003-58840 A | 2/2003 |
| JP | 2003-067711 A | 3/2003 |
| JP | 2003-076947 A | 3/2003 |
| JP | 2003-085501 A | 3/2003 |
| JP | 2003-085520 A | 3/2003 |
| JP | 2003-87008 A | 3/2003 |
| JP | 2003-87044 A | 3/2003 |
| JP | 2003-099720 A | 4/2003 |

| | | | |
|---|---|---|---|
| JP | 2003-099721 A | 4/2003 |
| JP | 2003-110344 A | 4/2003 |
| JP | 2003-132330 A | 5/2003 |
| JP | 2003-134007 A | 5/2003 |
| JP | 2003-155062 A | 5/2003 |
| JP | 2003-158414 A | 5/2003 |
| JP | 2003-187207 A | 7/2003 |
| JP | 2003-187211 A | 7/2003 |
| JP | 2003-198230 A | 7/2003 |
| JP | 2003-209421 A | 7/2003 |
| JP | 2003-218624 A | 7/2003 |
| JP | 2003-233780 A | 8/2003 |
| JP | 2003-242471 A | 8/2003 |
| JP | 2003-243918 A | 8/2003 |
| JP | 2003-288560 A | 10/2003 |
| JP | 2003-309418 A | 10/2003 |
| JP | 2003-331238 A | 11/2003 |
| JP | 2003-332820 A | 11/2003 |
| JP | 2004-88218 A | 3/2004 |
| JP | 2004-096566 A | 3/2004 |
| JP | 2004-253858 A | 9/2004 |
| JP | 2004-287767 A | 10/2004 |
| JP | 2004-297249 A | 10/2004 |
| JP | 2004-326380 A | 11/2004 |
| JP | 2004-334268 A | 11/2004 |
| JP | 2004-336250 A | 11/2004 |
| JP | 2004-343000 A | 12/2004 |
| JP | 2004-362190 A | 12/2004 |
| JP | 2004-362341 A | 12/2004 |
| JP | 2004-362602 A | 12/2004 |
| JP | 2005-136528 A | 5/2005 |
| JP | 2005-165839 A | 6/2005 |
| JP | 2005-167327 A | 6/2005 |
| JP | 2005-191705 A | 7/2005 |
| JP | 2005-210676 A | 8/2005 |
| JP | 2005-210680 A | 8/2005 |
| JP | 2005-217822 A | 8/2005 |
| JP | 2005-236339 A | 9/2005 |
| JP | 2005-244778 A | 9/2005 |
| JP | 2005-275870 A | 10/2005 |
| JP | 2005-295135 A | 10/2005 |
| JP | 2005-311205 A | 11/2005 |
| JP | 2005-321305 A | 11/2005 |
| JP | 2005-335755 A | 12/2005 |
| JP | 2005-346820 A | 12/2005 |
| JP | 2005-352858 A | 12/2005 |
| JP | 2006-031766 A | 2/2006 |
| JP | 2006-39902 A | 2/2006 |
| JP | 2006-67479 A | 3/2006 |
| JP | 2006-72706 A | 3/2006 |
| JP | 2006-80367 A | 3/2006 |
| JP | 2006-92630 A | 4/2006 |
| JP | 2006-102953 A | 4/2006 |
| JP | 2006-148518 A | 6/2006 |
| JP | 2006-195795 A | 7/2006 |
| JP | 2006-270212 A | 10/2006 |
| JP | 2006-309401 A | 11/2006 |
| JP | 2007-65822 A | 3/2007 |
| JP | 2007-150868 A | 6/2007 |
| JP | 11-175678 A | 1/2009 |
| NL | 9100176 A | 3/1992 |
| NL | 9100347 A | 3/1992 |
| WO | 02/089157 A1 | 11/2002 |
| WO | 03/079305 A1 | 9/2003 |
| WO | 2004/036772 A1 | 4/2004 |
| WO | 2004/051790 A2 | 6/2004 |
| WO | 2004/070879 A | 8/2004 |
| WO | 2004/072892 A1 | 8/2004 |
| WO | 2005/073937 A | 8/2005 |
| WO | 2005/115849 A1 | 12/2005 |
| WO | 2006/045682 A | 5/2006 |

OTHER PUBLICATIONS

Official communication issued in Japanese Application No. 2007-531525, mailed on Sep. 25, 2007.
Official communication issued in Japanese Application No. 2007-531524, mailed on Dec. 12, 2007.
Official communication issued in European Application No. 07706650.4, mailed on Nov. 24, 2008.
Mukku-Sha, "Musen IC Tagu Katsuyo-no Subete" "(All About Wireless IC Tags"), RFID, pp. 112-126.
Dokai et al.: "Wireless IC Device and Component for Wireless IC Device," U.S. Appl. No. 11/624,382, filed Jan. 18, 2007.
Dokai et al.: "Wireless IC Device, and Component for Wireless IC Device," U.S. Appl. No. 11/930,818, filed Oct. 31, 2007.
Kato et al.: "Wireless IC Device," U.S. Appl. No. 12/042,399, filed Mar. 5, 2008.
Official communication issued in related U.S. Appl. No. 12/042,399; mailed on Aug. 25, 2008.
English translation of NL9100176, published on Mar. 2, 1992.
English translation of NL9100347, published on Mar. 2, 1992.
Kato et al.: "Antenna," U.S. Appl. No. 11/928,502, filed Oct. 30, 2007.
Kato et al.: Wireless IC Device, U.S. Appl. No. 12/211,117, filed Sep. 16, 2008.
Kato et al.: "Antenna," U.S. Appl. No. 11/688,290, filed Mar. 20, 2007.
Kato et al.: "Electromagnetic-Coupling-Module-Attached Article," U.S. Appl. No. 11/740,509, filed Apr. 26, 2007.
Kato et al.: "Product Including Power Supply Circuit Board," U.S. Appl. No. 12/234,949, filed Sep. 22, 2008.
Kato et al.: "Data Coupler," U.S. Appl. No. 12/252,475, filed Oct. 16, 2008.
Kato et al.; "Information Terminal Device," U.S. Appl. No. 12/267,666, filed Nov. 10, 2008.
Dokai et al.: "Wireless IC Device and Component for Wireless IC Device," U.S. Appl. No. 12/359,690, filed Jan. 26, 2009.
Dokai et al.: "Optical Disc," U.S. Appl. No. 12/326,916, filed Dec. 3, 2008.
Dokai et al.: "System for Inspecting Electromagnetic Coupling Modules and Radio IC Devices and Method for Manufacturing Electromagnetic Coupling Modules and Radio IC Devices Using the System," U.S. Appl. No. 12/274,400, filed Nov. 20, 2008.
Kato: "Wireless IC Device," U.S. Appl. No. 11/964,185, filed Dec. 26, 2007.
Kato et al.: "Radio Frequency IC Device," U.S. Appl. No. 12/336,629, filed Dec. 17, 2008.
Kato et al.: "Wireless IC Device and Component for Wireless IC Device," U.S. Appl. No. 12/339,198, filed Dec. 19, 2008.
Ikemoto et al.: "Wireless IC Device," U.S. Appl. No. 11/851,651, filed Sep. 7, 2007.
Kataya et al.: "Wireless IC Device and Electronic Device," U.S. Appl. No. 11/851,661, filed Sep. 7, 2007.
Dokai et al.: "Antenna and Radio IC Device," U.S. Appl. No. 12/350,307, filed Jan. 8, 2009.
Official Communication issued in International Patent Application No. PCT/JP2007/060034, mailed on Aug. 21, 2007.
Official Communication issued in corresponding European Patent Application No. 07743469.4, mailed on Oct. 26, 2009.
Official Communication issued in corresponding Japanese Patent Application No. 2008-517826, mailed on Feb. 15, 2011.

\* cited by examiner

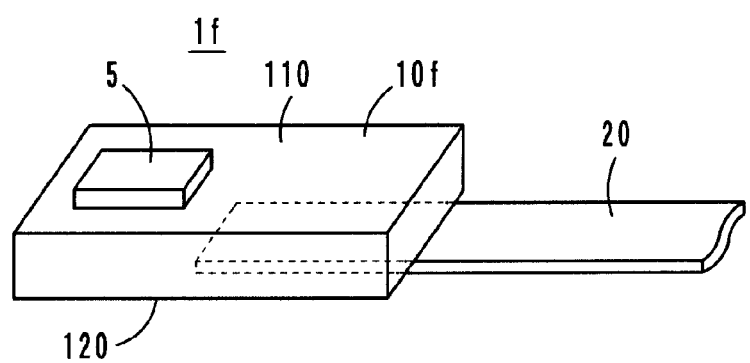
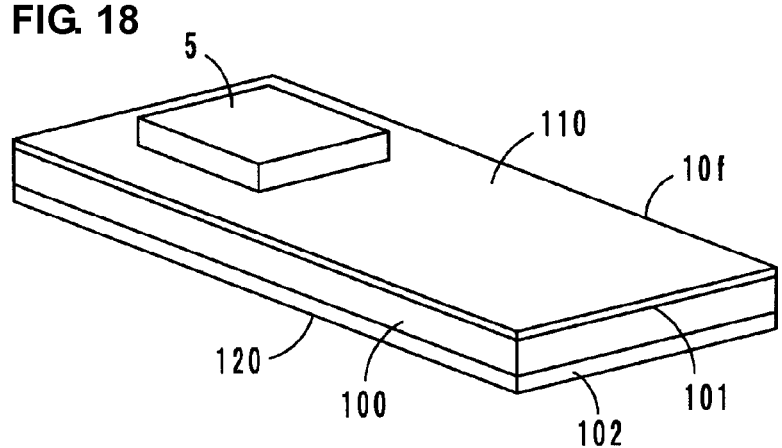

FIG. 26    1j
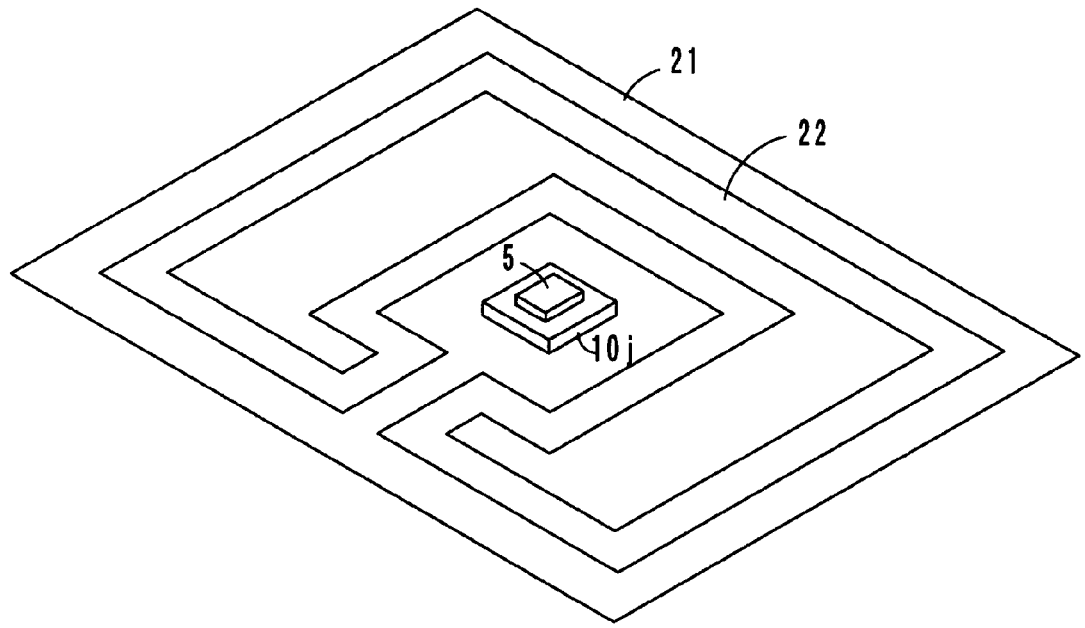
FIG. 27    1k
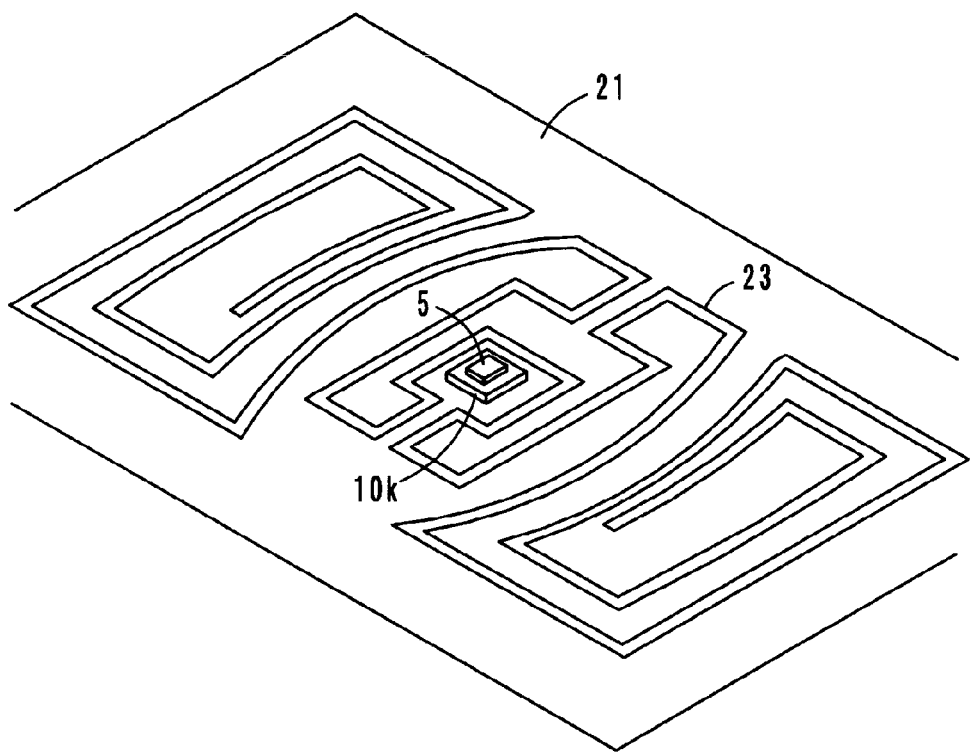

WIRELESS IC DEVICE AND WIRELESS IC DEVICE COMPOSITE COMPONENT

BACKGROUND OF THE INVENTION

1. Field of the Invention

The present invention relates to wireless integrated circuit (IC) devices. More particularly, the present invention relates to a wireless IC device used in a radio frequency identification (RFID) system and a wireless IC device composite component used in the wireless IC device.

2. Description of the Related Art

Recently, RFID systems have been developed as management systems of articles. In a typical RFID system, a reader-writer that generates an induction field communicates with a wireless tag (hereinafter referred to as a wireless IC device) that is attached to an article, that stores certain information, and that transmits the information in a non-contact manner.

Wireless IC devices used in the RFID systems are disclosed in, for example, U.S. Pat. No. 6,406,990 and U.S. Pat. No. 6,664,645.

Specifically, a wireless IC device shown in FIG. 32 is disclosed, in which an air-core type antenna pattern 304 made of an aluminum foil, a wireless IC chip 301 directly connected to locations on the antenna pattern 304 via Au bumps 302, and a resin layer 303 arranged so as to cover the Au bumps 302 to ensure the bonding strength of the wireless IC chip 301 are provided on a support film 305 made of polyethylene terephthalate (PET).

In this wireless IC device, the wireless IC chip 301 is directly connected to the antenna pattern 304 via the Au bumps 302 and it is necessary to arrange the wireless IC chip 301 on the support film 305 having an area that is significantly greater than that of the wireless IC chip 301. However, it is very difficult to accurately mount the wireless IC chip 301 on the large support film 305, and there is a problem in that the resonant frequency characteristics of the antenna vary if the wireless IC chip 301 is displaced from a desired location or if the sizes of the Au bumps 302 vary. In addition, since the frequency characteristics of the wireless IC device are substantially determined by the shape or size of the antenna pattern 304, the frequency characteristics are likely to vary if the antenna pattern 304 is curled or is sandwiched between dielectric bodies (for example, the antenna pattern 304 is sandwiched in a book).

Furthermore, the resonant frequency of signals transmitted or received by the wireless IC device is primarily determined by the electrical length of the antenna pattern. For example, when transmission-reception signals within a bandwidth of about 13.5 MHz are processed in the air-core type antenna pattern, the antenna pattern is increased in size because an inductance of about 4.5 µH is required.

SUMMARY OF THE DISCLOSURE

To overcome the problems described above, preferred embodiments of the present invention provide a small wireless IC device having stable frequency characteristics and a wireless IC device composite component.

A wireless IC device according to preferred embodiment of the present invention includes a wireless IC chip, a feed circuit board having the wireless IC chip mounted thereon and including a feed circuit including an inductance element, and a radiation plate electromagnetically coupled to the inductance element in the feed circuit. A high-permeability magnetic body made of a high-permeability magnetic material is provided in at least a portion of the feed circuit board and at least a portion of the inductance element is provided in the high-permeability magnetic body.

Since the wireless IC chip is mounted on the feed circuit board, the wireless IC chip can be accurately mounted on the board. Since the feed circuit board is electromagnetically coupled to the radiation plate, the composite component including the wireless IC chip and the feed circuit board can be easily mounted on the radiation plate by arranging the composite component directly on the radiation plate or arranging the composite component adjacent to the radiation plate.

In addition, since the frequencies of transmission and reception signals are substantially determined by the feed circuit provided in the feed circuit board, the frequency characteristics are not substantially varied even if the radiation plate is curled or is sandwiched between a dielectric body, thus achieving stable frequency characteristics.

Furthermore, since the inductance element defining the feed circuit is provided in the high-permeability magnetic body, it is possible to increase the Q value of the inductance element, to achieve stable frequency characteristics even if the size of the inductance element is reduced, and to reduce the size of the feed circuit board and the wireless IC device.

Other features, elements, steps, characteristics and advantages of the present invention will become more apparent from the following detailed description of preferred embodiments of the present invention with reference to the attached drawings.

BRIEF DESCRIPTION OF THE DRAWINGS

FIG. 17 is an external perspective view of the wireless IC device according to the fifth preferred embodiment of the present invention.

FIG. 18 is an external perspective view of the wireless IC device according to the fifth preferred embodiment of the present invention.

FIG. 26 is a perspective view of a wireless IC device according to a ninth preferred embodiment of the present invention.

FIG. 27 is a perspective view of a wireless IC device according to a tenth preferred embodiment of the present invention.

DETAILED DESCRIPTION OF PREFERRED EMBODIMENTS

Figure 1:
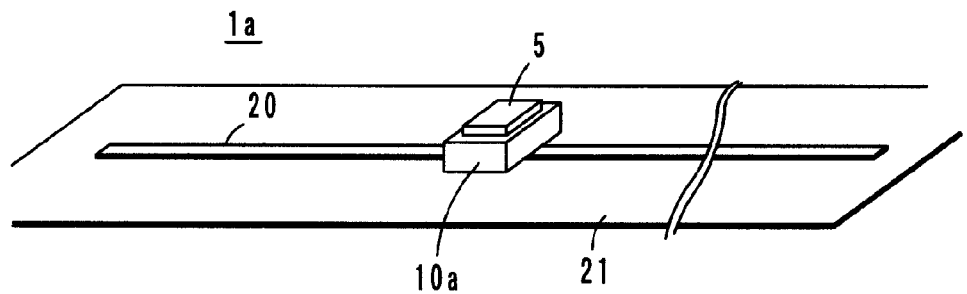
FIG. 1 is a perspective view showing a wireless IC device according to a first preferred embodiment of the present invention.

A wireless IC device according to preferred embodiments of the present invention preferably includes (1) a wireless IC chip, (2) a feed circuit board having the wireless IC chip mounted thereon and including a feed circuit including an inductance element, and (3) a radiation plate electromagnetically coupled to the inductance element in the feed circuit. In particular, the wireless IC device includes a high-permeability magnetic body made of a high-permeability magnetic material that is arranged in at least a portion of the feed circuit board and at least a portion of the inductance element and is provided in the high-permeability magnetic body.

Specifically, in the wireless IC device, the wireless IC chip is mounted on the feed circuit board and is connected to the radiation plate via the feed circuit board. Since the feed circuit board preferably has an area that is substantially less than that of the radiation plate, the wireless IC chip can be accurately mounted on the feed circuit board.

The feed circuit board includes the feed circuit having a function of determining the center frequency of transmission and reception signals, a function of matching the impedance of the wireless IC chip to the impedance of the radiation plate, and other suitable functions. The center frequency of transmission signals and/or the center frequency of reception signals are substantially determined by the feed circuit in the feed circuit board. In other words, since the frequencies of the transmission and reception signals are determined in the feed circuit board on which the wireless IC chip is accurately mounted, the frequency characteristics are not varied so as to achieve stable frequency characteristics regardless of the shape and size of the radiation plate and the location in which the radiation plate is arranged, for example, even if the wireless IC device is curled or is sandwiched between a dielectric body. The phrase "substantially determines" is used because the frequencies can be slightly shifted due to, for example, the positional relationship between the feed circuit board and the radiation plate.

Since the radiation plate is electromagnetically coupled to the feed circuit in the feed circuit board, it is possible to supply a transmission signal from the feed circuit board to the radiation plate and/or to supply a reception signal from the radiation plate to the feed circuit board without a bump connection made of Au, for example, as in the prior art, thus, greatly facilitating the connection between the radiation plate and the feed circuit board. As a result, the manufacturing process of the wireless IC device is simplified, the variation in the frequency characteristics is reduced, the manufacturing efficiency is improved, and the stable frequency characteristics are ensured. In other words, it is not necessary to use ultrasonic bonding using the Au bump, for example, and it is sufficient to use an adhesive, such as resin, to connect the feed circuit board to the radiation plate. Preferably, a magnetic adhesive, for example, can be used. The feed circuit board may be arranged adjacent to the radiation plate, instead of directly connecting the feed circuit board to the radiation plate.

In the wireless IC device of preferred embodiments of the present invention, since the inductance element including the feed circuit is provided in the high-permeability magnetic body made of a high-permeability magnetic material, the Q value of the inductance element can be increased. Accordingly, it is possible to provide the element having a sufficient inductance even if the size of the inductance element is reduced so as to achieve the stable frequency characteristics.

Preferably, the inductance element including the feed circuit is defined by a coil inductor pattern, such as a spiral or helical inductor pattern, for example, in the wireless IC device of preferred embodiments of the present invention. It is also preferable that the inductor pattern be arranged in the feed circuit board such that the winding axis of the inductor pattern is perpendicular or substantially perpendicular to the radiation plate. In other words, the magnetic flux generated in the direction of the winding axis of the inductor pattern is preferably used to couple the feed circuit to the radiation plate.

Preferably, the feed circuit board includes a non-magnetic body made of a low-permeability magnetic material or a non-magnetic material provided therein, and the winding portion adjacent to the radiation plate in the inductor pattern is provided in the non-magnetic body. The formation of at least the winding portion adjacent to the radiation plate in the inductor pattern in the non-magnetic body improves the transmission efficiency of the signals from the feed circuit to the radiation plate and the transmission efficiency of the signals from the radiation plate to the feed circuit without trapping the magnetic flux generated in the inductor pattern in the high-permeability magnetic body.

The permeabilities of the high-permeability magnetic body and the low-permeability magnetic body are not specifically restricted, and it is sufficient to set the permeabilities so as to have any relative difference between the permeability of the high-permeability magnetic body and that of the low-permeability magnetic body. Specifically, a material having a permeability of at least 15 is preferably used for the high-permeability magnetic body and a material having a permeability of less than 15 is preferably used for the low-permeability magnetic body, for example.

The inductance element including the feed circuit may preferably be defined by a coil inductor pattern, such as a spiral or helical inductor pattern, for example. This inductor pattern may be arranged in the feed circuit board such that the winding axis of the inductor pattern is substantially parallel to the radiation plate. In other words, the magnetic flux generated in a direction that is perpendicular or substantially perpendicular to the winding axis of the inductor pattern may preferably be used to couple the feed circuit to the radiation plate.

Preferably, the inductance element in the feed circuit board is defined by a coil inductor pattern, that is, is defined by a coil electrode pattern. This is because a coil electrode pattern, such as a spiral or helical electrode pattern, for example, can be used to easily control the magnetic flux and to facilitate the design particularly in a lower bandwidth, for example, in a bandwidth of about 13.5 MHz. In a higher frequency band, a meandering pattern may preferably be used, for example. Since the feed circuit is electromagnetically coupled to the radiation plate, it is preferable not to inhibit a variation in the magnetic flux generated by the inductor pattern, that is, the coil electrode pattern in the feed circuit board. For example, it is preferable that an opening be provided in a portion (a power feed portion) of the radiation plate, in which the magnetic flux generated by the inductor pattern is received. This improves the transmission efficiency of the signal energy and reduces the variation in frequency due to the displacement occurring when the feed circuit board is adhered to the radiation plate. In addition, the winding width of the coil electrode pattern preferably gradually increases toward the radiation plate because the transmission efficiency of the signals is improved with this configuration.

Preferably, the feed circuit provided in the feed circuit board includes the inductance element and a capacitance element that define an LC resonant circuit having a predetermined resonant frequency. This LC resonant circuit determines the center frequency of the transmission and reception signals and matches the impedance of the wireless IC chip to that of the radiation plate. The center frequencies of the transmission signals and/or the reception signals can be substantially determined by the resonant frequency of the LC resonant circuit on the feed circuit board.

The LC resonant circuit may preferably be an LC series resonant circuit or an LC parallel resonant circuit, for example. Alternatively, the LC resonant circuit may preferably include multiple LC series resonant circuits or multiple LC parallel resonant circuits, for example. Configuring the resonant circuit as a lumped constant resonant circuit including a capacitor pattern and an inductor pattern enables the resonant circuit to be easily designed in a lower bandwidth in which the transmission and reception signals have frequencies of about 5 GHz or less, for example, and is not significantly affected by other elements, such as the radiation plate. When the multiple resonant circuits are provided, by magnetically coupling the resonant circuits to each other, particularly, magnetically coupling the inductor elements to each other, the frequency band can be broadened.

The capacitance element defining the feed circuit may preferably be included in the feed circuit board as a capacitor pattern or may preferably be mounted on the feed circuit board as a surface mount portion, such as a chip ceramic capacitor, for example.

Preferably, the capacitance element defining the feed circuit is provided downstream of the wireless IC chip and is arranged between the wireless IC chip and the inductance element in order to protect the wireless IC chip from a surge, for example.

The capacitor pattern and the inductor pattern provided on the feed circuit board are preferably arranged substantially in parallel to and adjacent to the radiation plate. In this case, the electrical coupling by the capacitor pattern in the feed circuit, in addition to the magnetic coupling by the inductor pattern in the feed circuit, can be used to couple the radiation plate to feed circuit board, thus improving the transmission efficiency of the energy of the transmission and reception signals. A reflector and/or a waveguide may be arranged in order to provide the directivity of the magnetic flux to the portion in which the magnetic flux is generated by the inductor pattern. The reflector and/or the waveguide enable the radiation characteristics and the directivity from the feed circuit to the radiation plate to be easily adjusted. As a result, external electromagnetic effects are excluded so as to achieve the stable resonance characteristics.

Since the electromagnetic coupling between the radiation plate and the inductor pattern in the feed circuit is primarily used to connect the radiation plate to the feed circuit board, the radiation plate is preferably made of a magnetic metal material, such as iron, for example. However, the material of the radiation plate is not restricted to the magnetic metal material and a non-magnetic metal material, such as silver or copper, for example, may be used for the radiation plate. In addition, the radiation plate may be formed by printing metal paste including a metal material or metal-including ink on an article or a metal portion of an article may be used as the radiation plate. The radiation plate may preferably have various shapes, such as a thin film shape, a substantially rod shape, a substantially spiral coil shape, a substantially circular shape, or a substantially cylindrical shape, for example. The size of the radiation plate can be appropriately changed to adjust the transmission distance of signals.

In the feed circuit board, at least a portion of the inductance element, preferably the main portion thereof, is preferably provided in the high-permeability magnetic body. The high-permeability magnetic body preferably has a layered structure in view of the manufacturing method of the feed circuit board. However, the structure of the high-permeability magnetic body is not restricted to the layered structure. In addition, the feed circuit board is preferably a multilayer board in which dielectric layers, for example, having a predetermined permittivity are layered on the high-permeability magnetic layers defining the high-permeability magnetic body. In this case, the capacitor pattern and the inductor pattern are provided on the surface and/or inside of the multilayer board. Configuring the resonant circuit as the multilayer board enables the elements (for example, the electrode pattern) defining the resonant circuit to be formed not only on the surface of the board but also inside of the board to reduce the size of the board. In addition, the degree of freedom of the layout of the resonant circuit elements is improved and the performance of the resonant circuit is improved. The multilayer board may preferably be a resin multilayer board in which multiple resin layers are layered or may preferably be a ceramic multilayer board in which multiple ceramic layers are layered. Alternatively, the multilayer board may preferably be a thin-film multilayer board using a thin film forming technology, for example. With the ceramic multilayer board, it is preferable that the ceramic layers is made of a low-temperature sintering ceramic material that can be concurrently fired with a low melting point metal, such as silver or copper, for example. This is because the resonant circuit can be made of the silver or copper having a lower resistance, for example.

Furthermore, the feed circuit board may preferably be a single-layer board made of a high-permeability magnetic body. In this case, the capacitor pattern and/or the inductor pattern are provided on the surface of the single-layer board. The single-layer board may preferably be made of resin or ceramic, for example, as long as it is a high-permeability magnetic body. The capacitance generated by the capacitor pattern may be generated between planer electrodes provided on the top and bottom surfaces of the single-layer board or may be generated between electrodes arranged substantially in parallel on one surface of the single-layer board.

In particular, the feed circuit board is preferably a ceramic multilayer board in which multiple ceramic layers are layered. In this case, the capacitor pattern and the inductor pattern can be accurately provided, and, for example, a magnetic ceramic material can preferably be used to generate an inductor pattern having a desired inductance. Since the ceramic board is rigid, it is possible to mechanically protect the wireless IC chip and to easily mount the wireless IC chip.

Preferably, the feed circuit board is a rigid board and the radiation plate is defined by a flexible metal film. In addition, the flexible metal film is preferably disposed on a flexible resin film. The wireless IC chip can be stably mounted on the rigid board. In contrast, the radiation plate is preferably defined by a flexible metal film. The flexible radiation plate enables the wireless IC device to be adhered to an article having virtually any shape. The flexible metal film being disposed on a flexible resin film enables the wireless IC device itself to be easily handled. In particular, when all of the wireless IC chip, the feed circuit board, and the radiation plate are covered with a film, they can be easily protected from the external environment. The feed circuit board may not necessarily be rigid and may preferably be defined by a flexible board made of an organic resin material (for example, polyimide or liquid crystal polymer).

The electrical length of the radiation plate is preferably an integer multiple of the half-wavelength of the resonant frequency of the transmission and reception signals. The radiation plate having an electrical length that is an integer multiple of the half-wavelength of the resonant frequency maximizes the gain. However, since the frequency is substantially determined by the resonant circuit, the electrical length of the radiation plate is not required to be an integer multiple of the half-wavelength of the resonant frequency. This is a great advantage, as compared to when the radiation plate is an antenna element having a predetermined resonant frequency.

Preferred embodiments of the present invention provide a wireless IC device composite component including a wireless IC chip and a feed circuit board having the wireless IC chip mounted thereon and including a feed circuit including an inductance element. A high-permeability magnetic body made of a high-permeability magnetic material is provided in at least a portion of the feed circuit board and at least a portion of the inductance element is provided in the high-permeability magnetic body. Adhering this composite component to the metal portion of an arbitrary article enables the article to be used as a wireless IC device.

In the wireless IC device according to preferred embodiments of the present invention, the radiation plates may preferably be arranged on the top and bottom surfaces of the feed circuit board. Sandwiching the feed circuit board between the two radiation plates enables the energy radiated from the feed circuit to be transmitted to the respective radiation plates on the top and bottom surfaces of the feed circuit board, thus increasing the gain.

The connection between the wireless IC chip and the feed circuit board can be provided in various manners. For example, a chip-side electrode pattern may be provided on the wireless IC chip, a circuit-board-side electrode pattern may preferably be provided on the feed circuit board, and the chip-side electrode pattern may preferably be DC-connected to the first circuit-board-side electrode pattern. In this case, the chip-side electrode pattern can preferably be DC-connected to the first circuit-board-side electrode pattern with solder, conductive resin, or a gold bump, for example.

Alternatively, the chip-side electrode pattern may be capacitively or magnetically coupled to the first circuit-board-side electrode pattern. With the capacitive or magnetic coupling, it is not necessary to use the solder or the conductive resin, and the wireless IC chip can be adhered to the feed circuit board with an adhesive, such as resin, for example. In this case, it is not necessary for the chip-side electrode pattern and the first circuit-board-side electrode pattern to be provided on the surface of the wireless IC chip and the surface of the feed circuit board, respectively. For example, a resin film may be provided on the surface of the chip-side electrode pattern or the first circuit-board-side electrode pattern may be provided on an inner layer of the multilayer board.

With the capacitive coupling, the area of the first circuit-board-side electrode pattern is preferably greater than that of the chip-side electrode pattern. Even if the positional accuracy is slightly varied when the wireless IC chip is mounted on the feed circuit board, the variation in the capacitance generated between the electrode patterns is reduced. In addition, it is difficult to form the large electrode pattern on the small wireless IC chip whereas there is no problem to form the large electrode pattern on the feed circuit board because the feed circuit board is relatively large.

Since the required accuracy at which the wireless IC chip is mounted on the feed circuit board with the magnetic coupling is relatively low as compared to with the capacitive coupling, it is easy to mount the wireless IC chip on the feed circuit board. In addition, the chip-side electrode pattern and the first circuit-board-side electrode pattern are preferably coil electrode patterns. The coil electrode patterns, such as spiral or helical electrode patterns, for example, can be easily designed. At higher frequencies, it is effective to provide meandering electrode patterns.

In the wireless IC device according to preferred embodiments of the present invention, when a two-sided open radiation plate including a radiation portion that exchanges transmission and reception signals with external devices and a power feed portion that exchanges transmission and reception signals with the feed circuit (the resonant circuit) is provided, the presence of the radiation portion increases the antenna gain and a sufficient gain can be achieved even with a relatively small feed circuit pattern. In addition, the wireless IC device operates at a sufficient distance from a reader-writer and can be used even in frequency bands greater than the UHF frequency band. Furthermore, the resonant frequency is substantially determined by the feed circuit pattern, the shape of the radiation portion can be freely set, the gain can be adjusted by changing the size of the radiation portion, and the center frequency can be fine-tuned by changing the shape of the radiation portion.

At least a portion of the power feed portion of the radiation plate may preferably be arranged in the projection plane of the inductor pattern defining the feed circuit and it may be sufficient for the area of the power feed portion to be less than that of the projection plane of the inductor pattern. The projection plane means a plane surrounded by the outline of the inductor pattern and the area of the power feed portion means the area of the metal portion of the radiation plate. Since the power feed portion of the radiation plate is coupled to the inductor pattern via the magnetic field, the size of the portion blocking the magnetic flux of the feed circuit pattern is reduced so as to improve the transmission efficiency of signals when the area of the power feed portion is less than that of the projection plane of the inductor pattern.

The power feed portion may preferably be configured such that the longitudinal length of the power feed portion extends across the projection plane of the inductor pattern, for example, extending substantially linearly. The radiation portions of the radiation plate may be provided at both ends of the power feed portion or the radiation portion thereof may preferably be provided at one end of the power feed portion. The radiation portions provided at both ends of the power feed portion increases the capacitive coupling with the inductor pattern. The radiation portion provided only at one end of the power feed portion increases the magnetic coupling with the inductor pattern so as to increase the gain.

Multiple feed circuit patterns including inductor patterns and capacitor patterns may be provided on the feed circuit board. In this case, the power feed portion of the radiation plate is preferably arranged among the projection planes of the multiple feed circuit patterns. The power feed portion may preferably be arranged such that the longitudinal length of the power feed portion extends across the projection planes of the multiple feed circuit patterns, for example, extending substantially linearly. The arrangement of the power feed portion among the multiple feed circuit patterns increases the amount of power supply between the power feed portion and the feed circuit patterns.

The radiation plate may preferably include a radiation portion that is arranged in the x-y plane and that extends to in the directions of the x axis and the y axis. In this case, it is possible to receive a circularly polarized wave so as to increase the antenna gain. Alternatively, the radiation plate may include a radiation portion that extends in the directions of the x axis, the y axis, and the z axis in the x-y-z plane. The three-dimensional extension of the radiation plate enables efficient transmission and reception from any direction.

The radiation portion of the radiation plate may preferably extend perpendicular or substantially perpendicular to the plane on which the feed circuit pattern is provided. Specifically, the power feed portion may preferably be provided in a plane that is at the tip of a needle radiation portion and that is perpendicular or substantially perpendicular to the radiation portion and the power feed portion may preferably be coupled to the feed circuit pattern via the electric field or the magnetic field. In this case, it is possible to mount the wireless IC device to an article such that the needle radiation portion is inserted into the article.

The power feed portion and the feed circuit pattern may preferably be covered with a magnetic body. In this case, it is possible to prevent leakage of the electromagnetic energy. As a result, the level of coupling between the power feed portion and the feed circuit pattern is increased so as to increase the antenna gain.

Preferred embodiments of a wireless IC device according to the present invention will be described with reference to the attached drawings. The same reference numerals are used to identify the portions and components that are common to the preferred embodiments described below and duplicated descriptions of such parts and components are omitted herein.

First Preferred Embodiment

Figure 2:
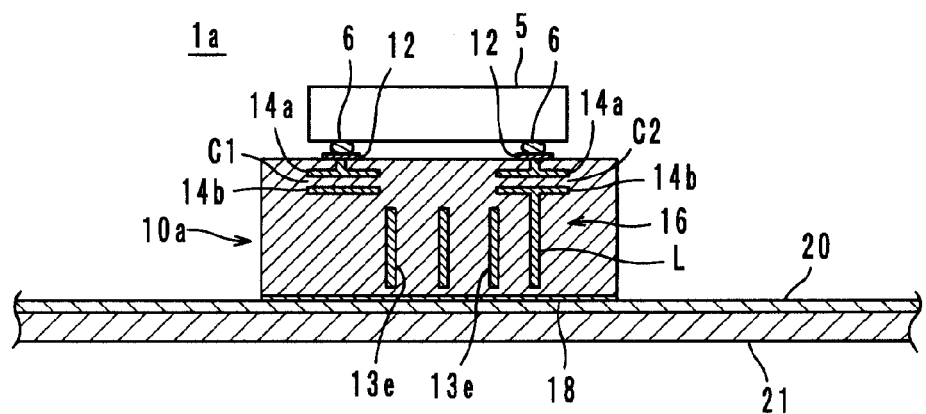
FIG. 2 is a cross-sectional view of the wireless IC device according to the first preferred embodiment of the present invention.

A wireless IC device 1a according to a first preferred embodiment of the present invention includes a monopole type radiation plate. As shown in FIGS. 1 and 2, the wireless IC device 1a includes a wireless IC chip 5, a feed circuit board 10a having the wireless IC chip 5 mounted on the top surface thereof, and a radiation plate 20 to which the feed circuit board 10a is adhered. The wireless IC chip 5 may preferably include clock circuits, logic circuits, and memory circuits and has necessary information stored therein. The wireless IC chip 5 is directly DC-connected to a feed circuit 16 included in the feed circuit board 10a.

The feed circuit board 10a is a ceramic multilayer board made of a magnetic ceramic material having a high permeability. The feed circuit 16 is a circuit arranged to supply a transmission signal having a predetermined frequency to the radiation plate 20 and/or a circuit arranged to select a reception signal having a predetermined frequency from signals received with the radiation plate 20 and to supply the reception signal to the wireless IC chip 5. The feed circuit 16 is provided with a resonant circuit that resonates at the frequencies of the transmission and reception signals.

Figure 3:
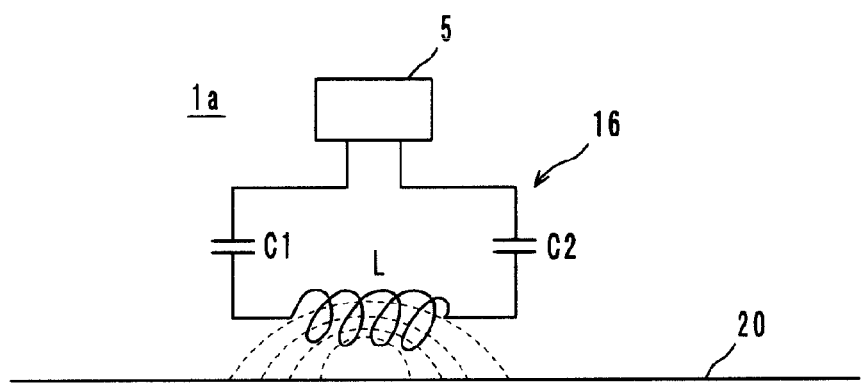
FIG. 3 is an equivalent circuit of the wireless IC device according to the first preferred embodiment of the present invention.
Figure 4:
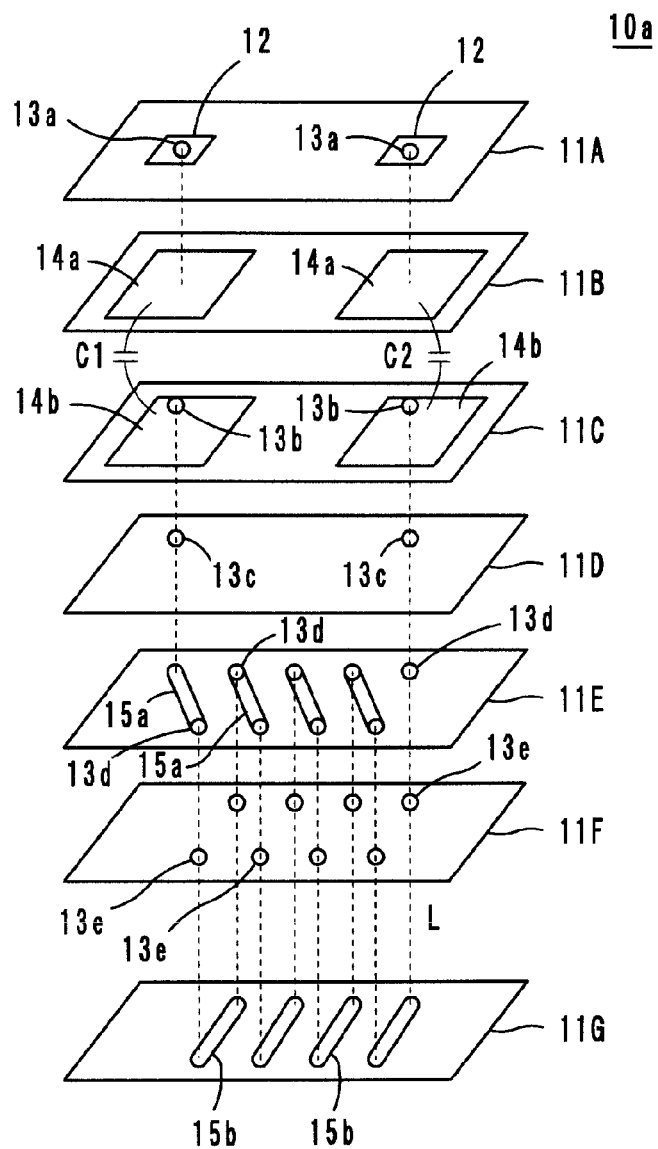
FIG. 4 is an exploded perspective view showing a feed circuit board in the wireless IC device according to the first preferred embodiment of the present invention.

The feed circuit board 10a includes the feed circuit 16 defined by a lumped constant LC series resonant circuit including a helical inductance element L and capacitance elements C1 and C2, as shown in FIGS. 2 and 3. Specifically, as shown in FIG. 4, the feed circuit board 10a is manufactured by layering, attaching by pressure, and firing ceramic sheets 11A to 11G made of high-permeability magnetic bodies. The feed circuit board 10a includes the sheet 11A on which connection electrodes 12 and via-hole conductors 13a are provided, the sheet 11B on which capacitance electrodes 14a are provided, the sheet 11C on which capacitance electrodes 14b and via-hole conductors 13b are provided, the sheet 11D on which via-hole conductors 13c are provided, the sheet 11E on which conductive patterns 15a and via-hole conductors 13d are provided, the sheet or sheets 11F on which via-hole conductors 13e are provided, and the sheet 11G on which conductive patterns 15b are provided. Each of the ceramic sheets 11A to 11G can be easily manufactured by a manufacturing process for a multilayer board, such as, for example, a sheet layering method or a thick film printing method that are conventionally used.

Layering the ceramic sheets 11A to 11G forms the helical inductance element L whose winding axis is parallel or substantially parallel to the radiation plate 20 and the capacitance elements C1 and C2 in which the capacitance electrodes 14b are connected to both ends of the inductance element L and the capacitance electrodes 14a are connected to the connection electrodes 12 via the via-hole conductors 13a. The connection electrodes 12, which are circuit-board-side electrode patterns, are DC-connected to chip-side electrode patterns (not shown) of the wireless IC chip 5 via solder bumps 6, for example.

Specifically, a transmission signal is supplied from the inductance element L, which is a coil electrode pattern among the elements defining the feed circuit 1, and to the radiation plate 20 through the magnetic field, and a reception signal from the radiation plate 20 is supplied to the inductance element L through the magnetic field. Accordingly, it is preferable that, among the inductance element L and the capacitance elements C1 and C2 defining the resonant circuit, the inductance element L be arranged so as to be in the vicinity of the radiation plate 20 in the feed circuit board 10a.

The radiation plate 20 may preferably be a magnetic body made of iron, for example, or may preferably be a long body made of a non-magnetic material, such as an aluminum foil or a copper foil, for example, that is a two-ended open metallic body. The radiation plate 20 is provided on a flexible insulative resin film 21 made of PET, for example. The bottom surface of the feed circuit board 10a is adhered to the radiation plate 20 via a magnetic or insulative adhesive layer 18.

Non-limiting examples of the sizes are shown here. The thickness of the wireless IC chip 5 is preferably about 50 μm to about 100 μm, the thickness of the solder bumps 6 is preferably about 20 μm, the thickness of the feed circuit board 10a is preferably about 200 μm to 500 μm, the thickness of the adhesive layer 18 is about 0.1 μm to about 10 μm, the thickness of the radiation plate 20 is about 1 μm to about 50 μm, and the thickness of the film 21 is about 10 μm to about 100 μm. The wireless IC chip 5 may have various sizes (areas), such as about 0.4 mm×about 0.4 mm or about 0.9 mm×about 0.8 mm. The feed circuit board 10a may have a size (area) from substantially the same size as that of the wireless IC chip 5 to a size of 3 about mm×about 3 mm.

FIG. 3 illustrates an equivalent circuit of the wireless IC device 1a. In the wireless IC device 1a, the radiation plate 20 receives a high-frequency signal, for example, in a UHF frequency band, radiated from a reader-writer (not shown), the feed circuit 16 defined by the LC series resonant circuit including the inductance element L and the capacitance elements C1 and C2 primarily magnetically coupled to the radiation plate 20 is resonated, and only a reception signal having a predetermined frequency is supplied to the wireless IC chip 5. Conversely, after an energy of a certain amount is extracted from the reception signal and the information stored in the wireless IC chip 5 is matched to a predetermined frequency by the feed circuit 16 using the extracted energy as a drive power, a transmission signal is supplied from the inductance element L in the feed circuit 16 to the radiation plate 20 through the magnetic coupling and the transmission signal is transmitted and transferred from the radiation plate 20 to the reader-writer.

Although the feed circuit 16 is primarily coupled to the radiation plate 20 via the magnetic field, the connection via the electric field may also exist between the feed circuit 16 and the radiation plate 20, via electromagnetic coupling.

In the wireless IC device 1a according to the first preferred embodiment, the wireless IC chip 5 is directly DC-connected to the feed circuit board 10a including the feed circuit 16 and the feed circuit board 10a has approximately the same area as that of the wireless IC chip 5 and is rigid. Accordingly, it is possible to more accurately position and mount the wireless IC chip 5, as compared to when the wireless IC chip 5 is mounted on a large flexible film as in a conventional wireless IC device. In addition, since the feed circuit board 10a is preferably made of a magnetic ceramic material and has a heat resisting property, the wireless IC chip 5 can be attached to the feed circuit board 10a with solder. In other words, since an ultrasonic bonding method is not used, unlike conventional cases, it is possible to inexpensively manufacture the wireless IC chip 5 and the wireless IC chip 5 is prevented from being damaged by the pressure applied in the ultrasonic bonding. In addition, a self-alignment feature due to solder reflow can be used.

In the feed circuit 16, the resonant circuit including the inductance element L and the capacitance elements C1 and C2 determines the resonant frequency characteristics. The resonant frequency of a signal radiated from the radiation plate 20 substantially corresponds to the self-resonant frequency of the feed circuit 16, and the maximum gain of the signal is substantially determined by at least one of the size of the feed circuit 16, the shape thereof, the distance between the feed circuit 16 and the radiation plate 20, and the medium therebetween. Specifically, according to the preferred first embodiment, the electrical length of the radiation plate 20 preferably is approximately half of a resonant frequency $\lambda$. However, the electrical length of the radiation plate 20 may not be approximately half of the resonant frequency $\lambda$. Specifically, since the frequency of a signal radiated from the radiation plate 20 is substantially determined by the resonant frequency of the resonant circuit (i.e., the feed circuit 16) in preferred embodiments of the present invention, the frequency characteristics do not substantially depend on the electrical length of the radiation plate 20. Preferably, the electrical length of the radiation plate 20 is an integer multiple of $\lambda/2$ because the gain is maximized with such electrical lengths.

As described above, since the resonant frequency characteristics of the feed circuit 16 are determined by the resonant circuit including the inductance element L and the capacitance elements C1 and C2 included in the feed circuit board 10a, the resonant frequency characteristics are not substantially changed if the wireless IC device 1a is sandwiched between a book, for example. Even if the wireless IC device 1a is curled to change the shape of the radiation plate 20 or to change the size of the radiation plate 20, the resonant frequency characteristics are not substantially changed or affected. Since the winding axis of the coil electrode pattern defining the inductance element L is arranged so as to be substantially parallel to the radiation plate 20, the coil electrode pattern has the advantage that the center frequency is not changed. Since the capacitance elements C1 and C2 are provided downstream of the wireless IC chip 5, a low-frequency surge can be blocked by the capacitance elements C1 and C2 to protect the wireless IC chip 5 from the surge.

In addition, since the feed circuit board 10a is a rigid multilayer board, it is helpful for processing when the wireless IC chip 5 is soldered to the feed circuit board 10a. Furthermore, since the radiation plate 20 is made of a flexible metal film disposed on the flexible film 21, the radiation plate 20 can be adhered to a soft bag made of a plastic film or a cylindrical body, such as a PET bottle, for example, without difficulty.

According to preferred embodiments of the present invention, the resonant circuit may also function as a matching circuit arranged to match the impedance of the wireless IC chip to that of the radiation plate. Alternatively, the feed circuit board may further be provided with a matching circuit that includes the inductance element and the capacitance elements and that is provided separately from the resonant circuit. The addition of the function of the matching circuit to the resonant circuit tends to complicate the design of the resonant circuit. The provision of the matching circuit separately from the resonant circuit enables the resonant circuit and the matching circuit to be independently designed.

Second Preferred Embodiment

Figure 5:
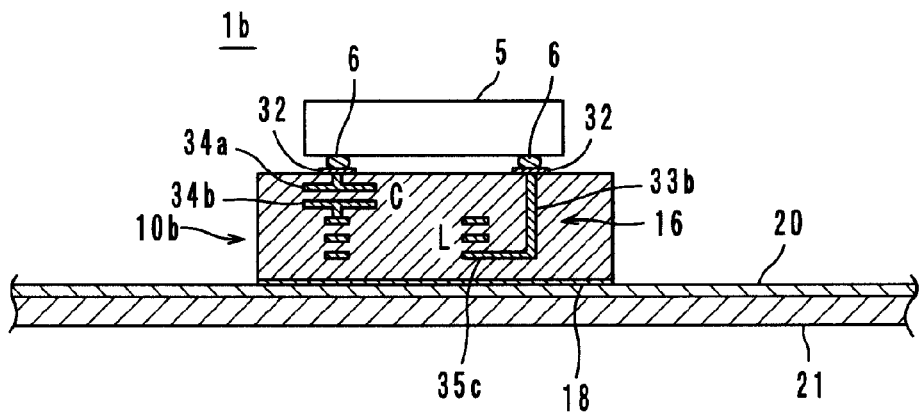
FIG. 5 is a cross-sectional view showing a wireless IC device according to a second preferred embodiment of the present invention.
Figure 6:
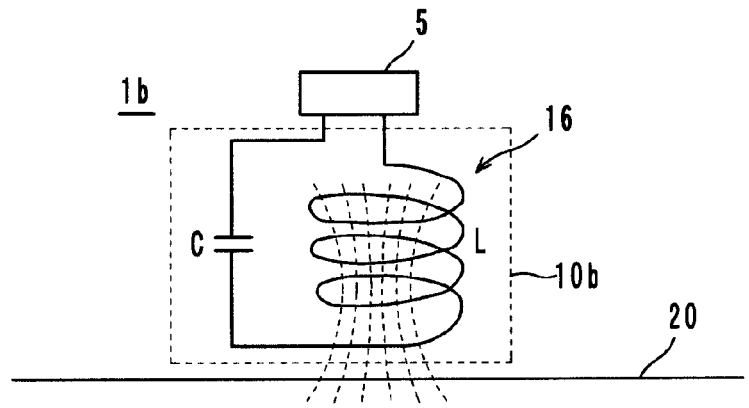
FIG. 6 is an equivalent circuit of the wireless IC device according to the second preferred embodiment of the present invention.

A wireless IC device 1b according to a second referred embodiment of the present invention is provided with a monopole type radiation plate, as shown in FIG. 5. The wireless IC device 1b includes the feed circuit 16 that is included in a feed circuit board 10b and that is defined by an LC series resonant circuit including an inductance element L and a capacitance element C. As shown in FIG. 6, the winding axis of the coil electrode pattern defining the inductance element L is perpendicular or substantially perpendicular to the radiation plate 20, and the feed circuit 16 is primarily magnetically coupled to the radiation plate 20.

Figure 7:
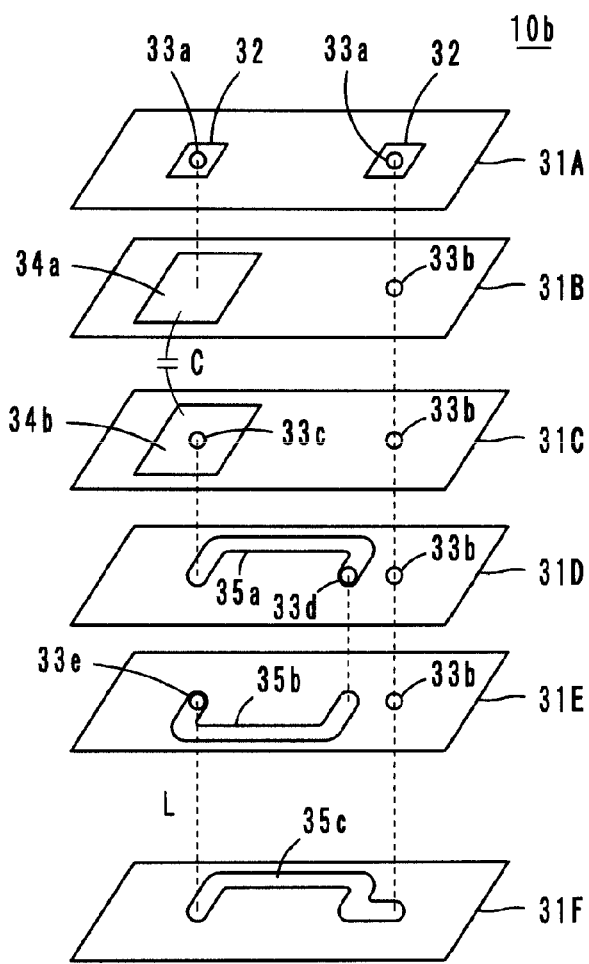
FIG. 7 is an exploded perspective view showing a feed circuit board in the wireless IC device according to the second preferred embodiment of the present invention.

Specifically, as shown in FIG. 7, the feed circuit board 10b is manufactured by layering, attaching by pressure, and firing ceramic sheets 31A to 31F defined by high-permeability magnetic bodies. The feed circuit board 10b includes the sheet 31A on which connection electrodes 32 and via-hole conductors 33a are provided, the sheet 31B on which a capacitance electrode 34a and a via-hole conductor 33b are provided, the sheet 31C on which a capacitance electrode 34b, the via-hole conductor 33b, and a via-hole conductor 33c are provided, the sheet or sheets 31D on which a conductive pattern 35a, the via-hole conductor 33b, and a via-hole conductor 33d are provided, the sheet or sheets 31E on which a conductive pattern 35b, the via-hole conductor 33b, and a via-hole conductor 33e are provided, and the sheet 31F on which a conductive pattern 35c is provided.

Layering the ceramic sheets 31A to 31F provides the feed circuit 16 defined by the LC series resonant circuit in which the capacitance element C is connected in series to the helical inductance element L whose winding axis is substantially perpendicular to the radiation plate 20. The capacitance electrode 34a is connected to the connection electrode 32 via the via-hole conductor 33a and is further connected to the wireless IC chip 5 via the solder bump 6. One end of the inductance element L is connected to the connection electrode 32 via the via-hole conductor 33b and is further connected to the wireless IC chip 5 via the solder bump 6.

The effects and advantages of the second preferred embodiment are similar to those of the first preferred embodiment. Specifically, in the wireless IC device 1b, the radiation plate 20 receives a high-frequency signal, for example, in a UHF frequency band, radiated from a reader-writer (not shown), the feed circuit 16 defined by the LC series resonant circuit including the inductance element L and the capacitance element C primarily magnetically coupled to the radiation plate 20 is resonated, and only a reception signal having a predetermined frequency is supplied to the wireless IC chip 5. Conversely, after an energy of a certain amount is extracted from the reception signal and the information stored in the wireless IC chip 5 is matched to a predetermined frequency by the feed circuit 16 by using the extracted energy as a drive power, a transmission signal is supplied from the inductance element L in the feed circuit 16 to the radiation plate 20 through the magnetic coupling and the transmission signal is transmitted and transferred from the radiation plate 20 to the reader-writer.

Particularly, since the winding axis of the coil electrode pattern is perpendicular or substantially perpendicular to the radiation plate 20 in the second preferred embodiment, the component of the magnetic flux toward the radiation plate 20 is increased so as to improve the transmission efficiency of the signal energy, thus preferably achieving a higher gain.

Figure 8:
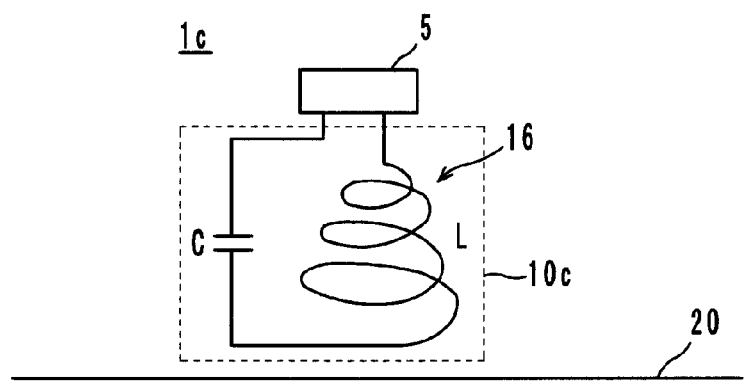
FIG. 8 is an equivalent circuit of a modification of the wireless IC device according to the second preferred embodiment of the present invention.

As shown in FIG. 8 as an equivalent circuit, the winding width (i.e., the coil diameter) of the coil electrode pattern defining the inductance element L provided in a feed circuit board 10c may preferably be gradually increased toward the radiation plate 20. Since the winding width of the coil electrode pattern of the inductance element L is gradually increased toward the radiation plate 20 in the wireless IC device 1c, the transmission efficiency of the signal is improved.

Third Preferred Embodiment

Figure 9:
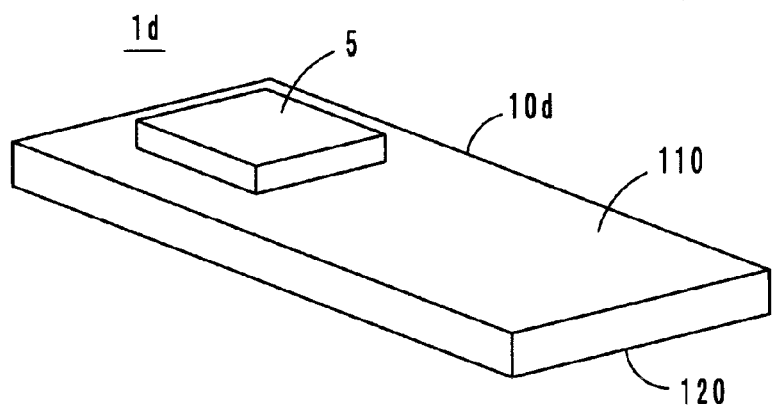
FIG. 9 is an external perspective view of a wireless IC device composite component according to a third preferred embodiment of the present invention.

In a wireless IC device 1d according to a third preferred embodiment of the present invention, as shown in FIG. 9, the wireless IC chip 5 is mounted on a first main surface 110 of a feed circuit board 10d defined by a high-permeability magnetic body and a radiation plate (not shown) is provided on a second main surface 120 of the feed circuit board 10d. FIG. 9 shows a wireless IC device composite component including the wireless IC chip 5 and the feed circuit board 10d.

Figure 10:
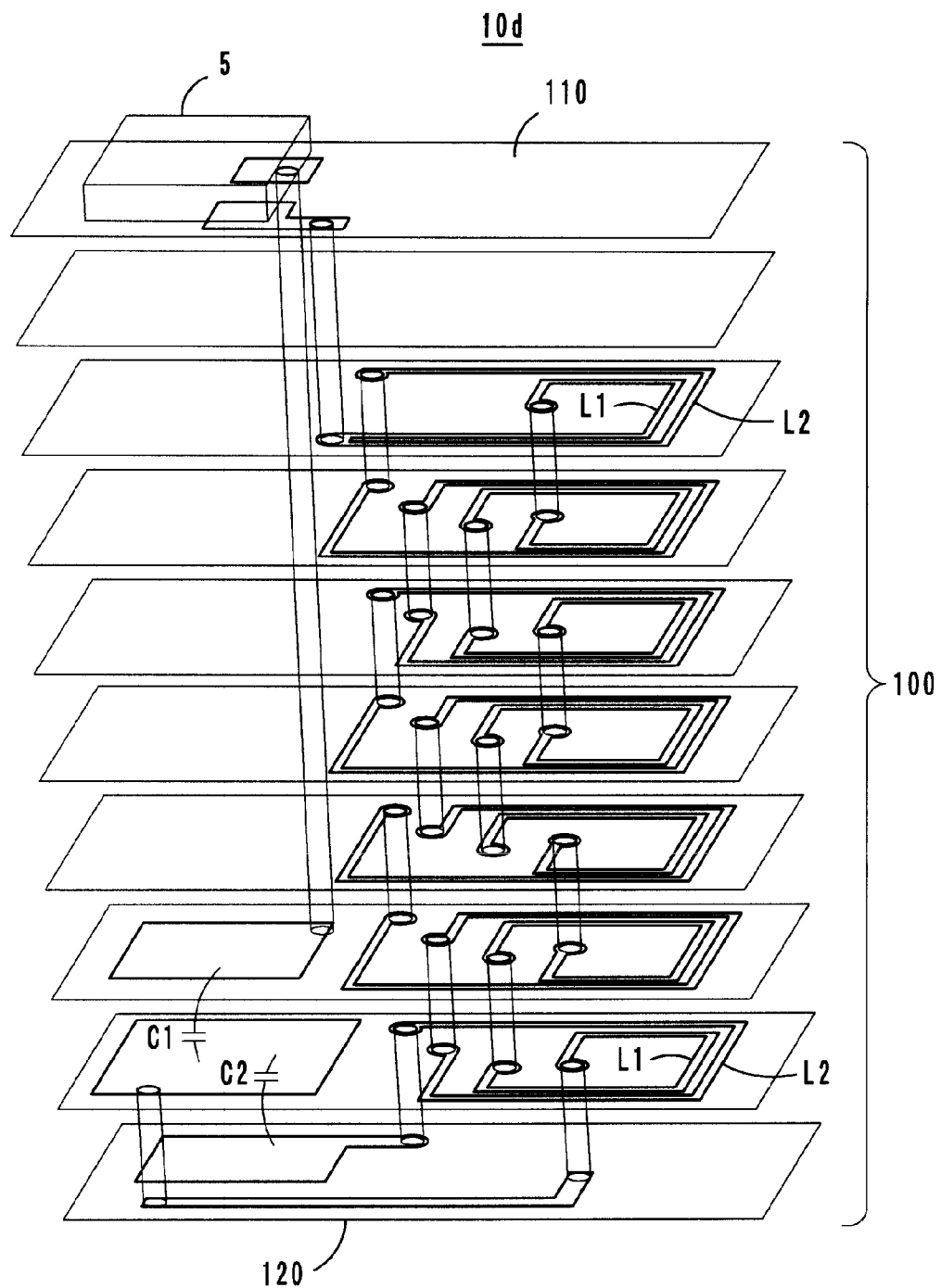
FIG. 10 is an exploded perspective view showing a feed circuit board in the wireless IC device according to the third preferred embodiment of the present invention.

The feed circuit board 10d has a multilayer structure which includes capacitance electrodes defining the capacitance elements C1 and C2 and the inductance elements L1 and L2, and in which high-permeability magnetic layers 100 preferably made of a high-permeability magnetic ceramic material are layered, as shown in FIG. 10.

Figure 11:
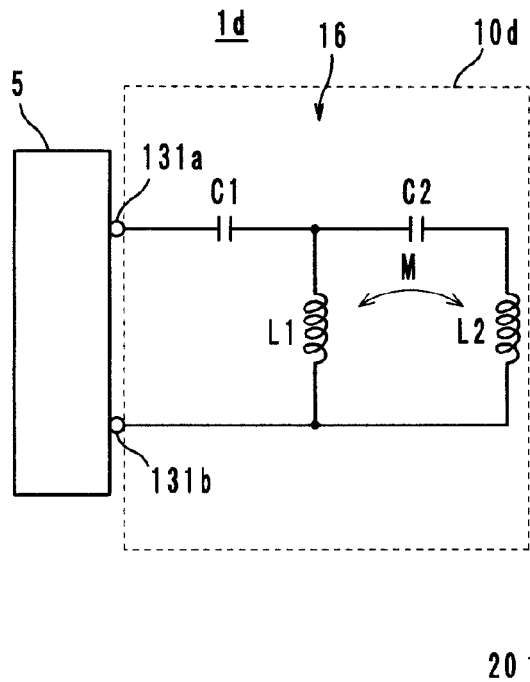
FIG. 11 is an equivalent circuit of the wireless IC device according to the third preferred embodiment of the present invention.

In the wireless IC device 1d, as shown as an equivalent circuit in FIG. 11, the feed circuit 16 includes the inductance elements L1 and L2 magnetically coupled to each other (denoted by reference numeral M). One end of the inductance element L1 is connected to the wireless IC chip 5 via the capacitance element C1 and a connection electrode 131a and is connected to one end of the inductance element L2 via the capacitance element C2. The other end of the inductance element L1 and the other end of the inductance element L2 are connected to the wireless IC chip 5 via a connection electrode 131b. In other words, the feed circuit 16 includes an LC series resonant circuit including the inductance element L1 and the capacitance element C1 and an LC series resonant circuit including the inductance element L2 and the capacitance element C2. Both of the inductance elements L1 and L2 are magnetically coupled to the radiation plate 20.

Figure 12:
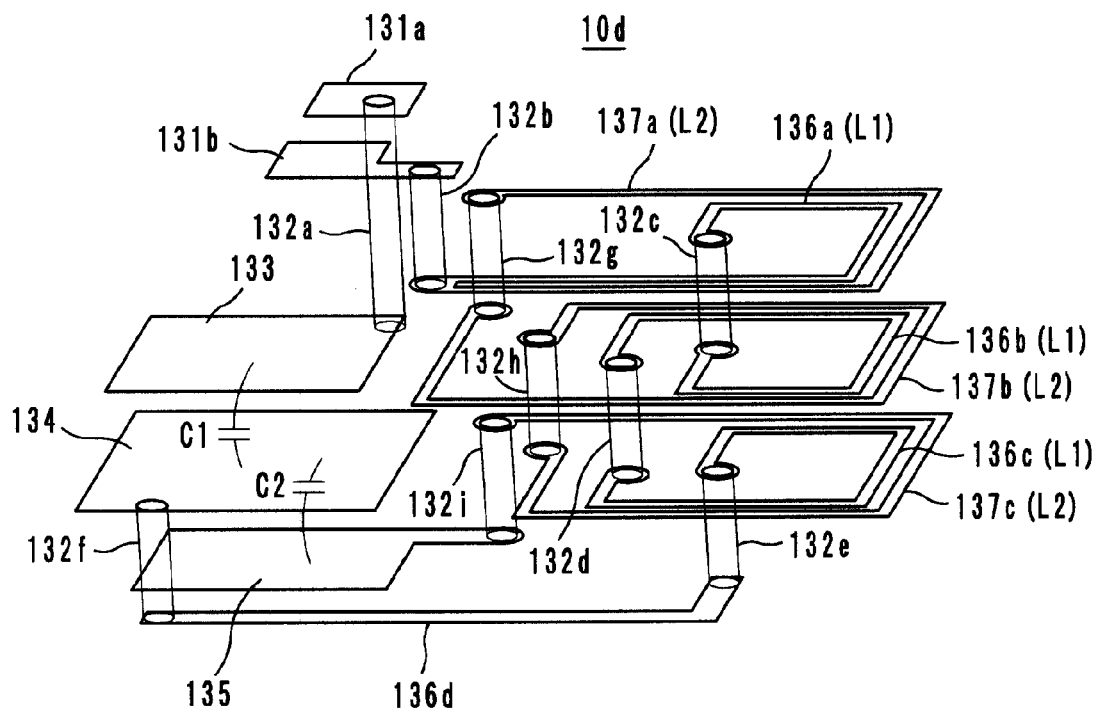
FIG. 12 is an exploded perspective view showing in detail the feed circuit board in the wireless IC device according to the third preferred embodiment of the present invention.

The feed circuit board 10d will now be described in more detail. As shown in FIG. 12, the connection electrode 131a is connected to a capacitance electrode 133 via a via-hole conductor 132a and the capacitance electrode 133 opposes a capacitance electrode 134 to define the capacitance element C1. The capacitance electrode 134 opposes a capacitance electrode 135 to define the capacitance element C2. The connection electrode 131b is connected to conductive patterns 136a and 137a produced by bifurcation via a via-hole conductor 132b. The conductive pattern 136a is connected to a conductive pattern 136b via a via-hole conductor 132c, is further connected to a conductive pattern 136c via a via-hole conductor 132d, and is further connected to a conductive pattern 136d via a via-hole conductor 132e. The conductive pattern 136d is connected to the capacitance electrode 134 via a via-hole conductor 132f.

The conductive pattern 137a is connected to a conductive pattern 137b via a via-hole conductor 132g, is further connected to a conductive pattern 137c via a via-hole conductor 132h, and is further connected to the capacitance electrode 135 via a via-hole conductor 132i. The conductive patterns 136a, 136b, and 136c define the inductance element L1 and the conductive patterns 137a, 137b, and 137c define the inductance element L2.

The high-permeability magnetic layers made of a high-permeability magnetic ceramic material are not shown in FIG. 12. In addition, three layers of the conductive patterns defining the inductance elements L1 and L2 are shown in FIG. 12 for simplicity.

In the wireless IC device 1d, the radiation plate 20 receives a high-frequency signal (for example, in a UHF frequency band) radiated from a reader-writer (not shown), the feed circuit 16 including the LC series resonant circuit composed of the inductance element L1 and the capacitance element C1 and the LC series resonant circuit defined by the inductance element L2 and the capacitance element C2 primarily magnetically coupled to the radiation plate 20 is resonated, and only a reception signal having a predetermined frequency is supplied to the wireless IC chip 5. Conversely, after an energy of a certain amount is extracted from the reception signal and the information stored in the wireless IC chip 5 is matched to a predetermined frequency by the feed circuit 16 by using the extracted energy as a drive power, a transmission signal is supplied from the inductance elements L1 and L2 in the feed circuit 16 to the radiation plate 20 through the magnetic coupling and the transmission signal is transmitted and transferred from the radiation plate 20 to the reader-writer.

Particularly, the capacitance electrodes 133, 134, and 135, the inductor conductive patterns 136a to 136c, and the inductor conductive patterns 137a to 137c are provided substantially in parallel to the radiation plate 20 in the third preferred embodiment. Accordingly, the magnetic field generated by the inductor conductive patterns 136a to 136c and the inductor conductive patterns 137a to 137c is not blocked by the capacitance electrodes 133, 134, and 135 and, therefore, the radiation characteristics from the inductor conductive patterns 136a to 136c and the inductor conductive patterns 137a to 137c are improved.

Figure 13A:
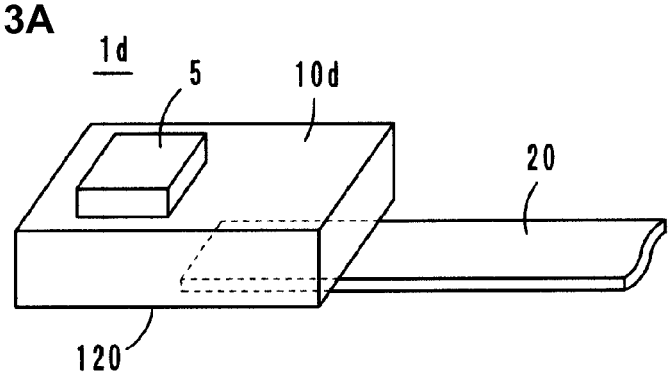
FIGS. 13A, 13B and 13C include external perspective views showing examples of arrangement of a radiation plate in the wireless IC device according to the third preferred embodiment of the present invention.
Figure 13B:
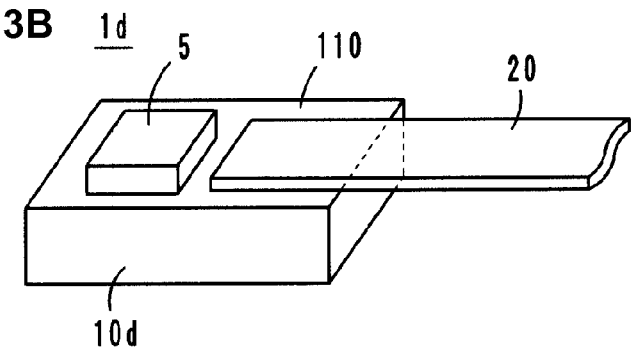
Figure 13C:
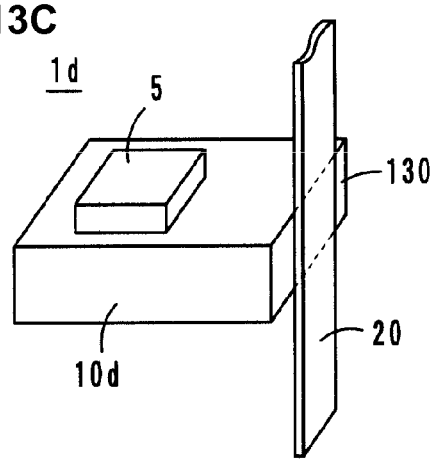

The radiation plate 20 is preferably adhered to the second main surface 120 of the feed circuit board 10d such that one end of the radiation plate 20 opposes the inductor conductive patterns in the third preferred embodiment, as shown in FIG. 13A. However, as shown in FIG. 13B, the radiation plate 20 may be adhered to the first main surface 110 such that one end of the radiation plate 20 opposes the inductor conductive patterns. Alternatively, as shown in FIG. 13C, the radiation plate 20 may be adhered to a side surface 130 by which the first main surface 110 and the second main surface 120 are connected.

Fourth Preferred Embodiment

Figure 14:
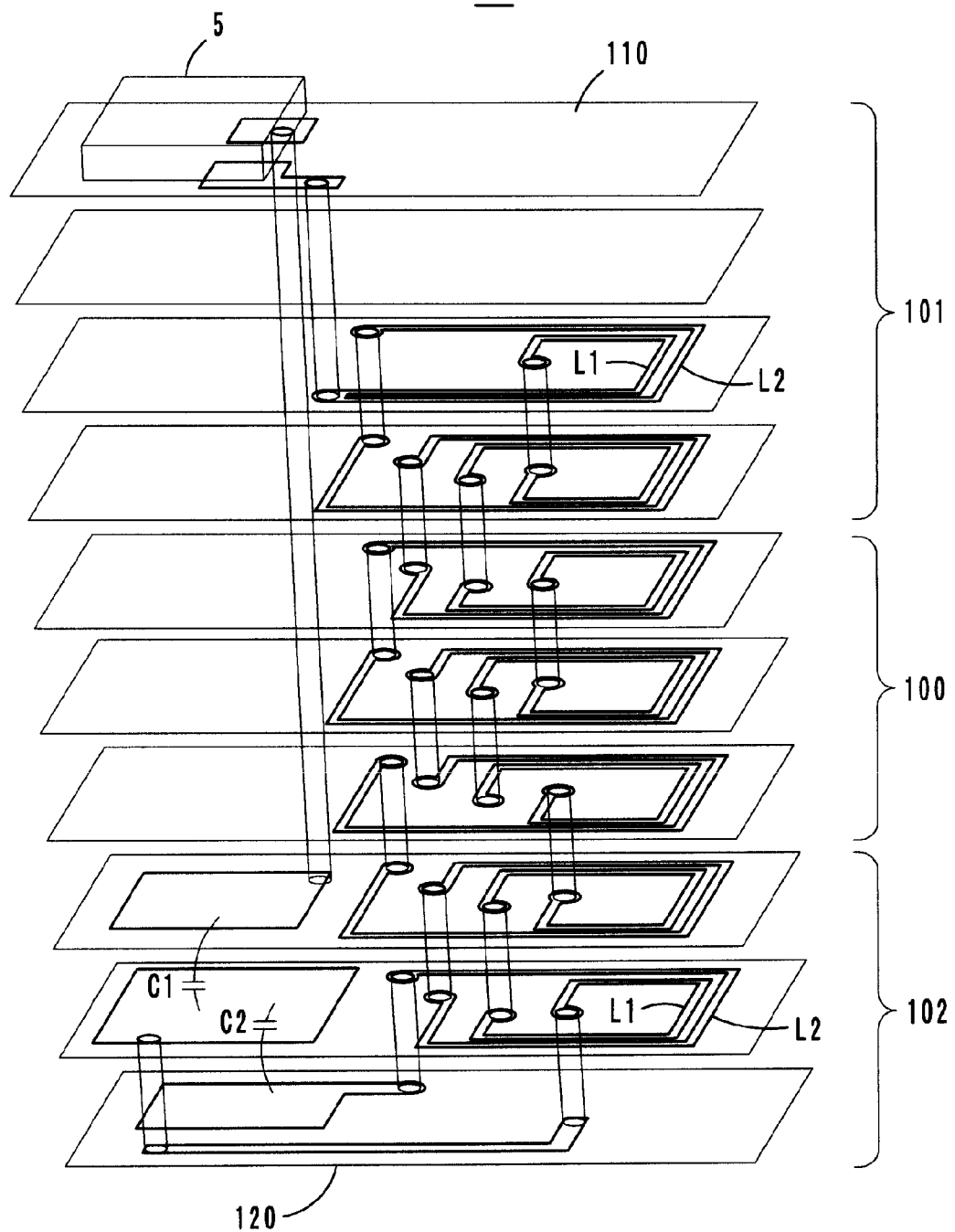
FIG. 14 is an exploded perspective view of a wireless IC device according to a fourth preferred embodiment of the present invention.

As shown in FIG. 14, in a wireless IC device 1e according to a fourth preferred embodiment of the present invention, a feed circuit board 10e includes the wireless IC chip 5 disposed on a first main surface 110. The feed circuit board 10e has a multilayer structure in which non-magnetic layers 101 and 102 made of a low-permeability magnetic ceramic material or a non-magnetic ceramic material are layered on opposed sides of the high-permeability magnetic layers 100 made of a high-permeability magnetic ceramic material, respectively. The structure of the capacitance elements C1 and C2 and the inductance elements L1 and L2 and the equivalent circuit thereof in the feed circuit board 10e are similar to those in the third preferred embodiment.

Figure 15:
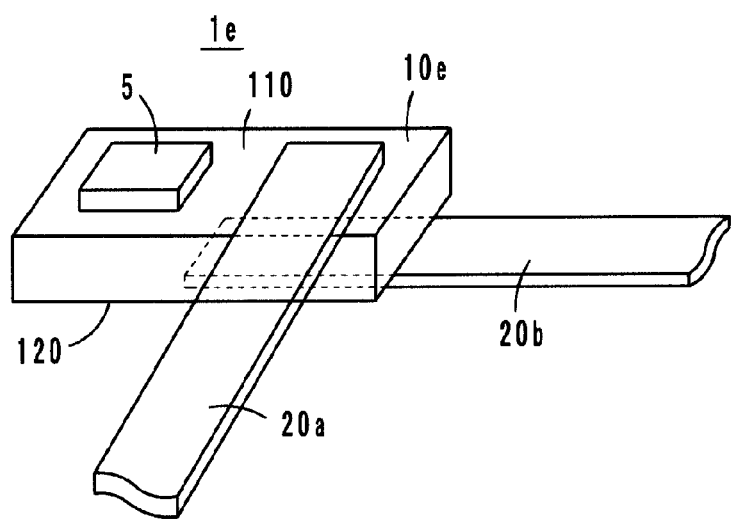
FIG. 15 is an external perspective view of the wireless IC device according to the fourth preferred embodiment of the present invention.

As shown in FIG. 15, radiation plates are provided at desired locations on the first main surface 110 and the second main surface 120 of the feed circuit board 10e as radiation plates 20a and 20b, respectively. The direction in which the radiation plate 20a extends may preferably be substantially perpendicular to the direction in which the radiation plate 20b extends, as shown in FIG. 15.

In the feed circuit board 10e, the first-main-surface-side winding portion and the second-main-surface-side winding portion, among the inductor conductive patterns defining the inductance elements L1 and L2, are provided in the non-magnetic layers 101 and 102, respectively. Accordingly, the magnetic flux generated by the inductor conductive patterns efficiently propagates to the radiation plates 20a and 20b via the non-magnetic layers 101 and 102 so as to increase the gain. In addition, since the capacitance elements C1 and C2 are provided in the non-magnetic layers 102, it is possible to provide the capacitance elements having increased capacitances if the layers have increased permittivity.

Fifth Preferred Embodiment

Figure 16:
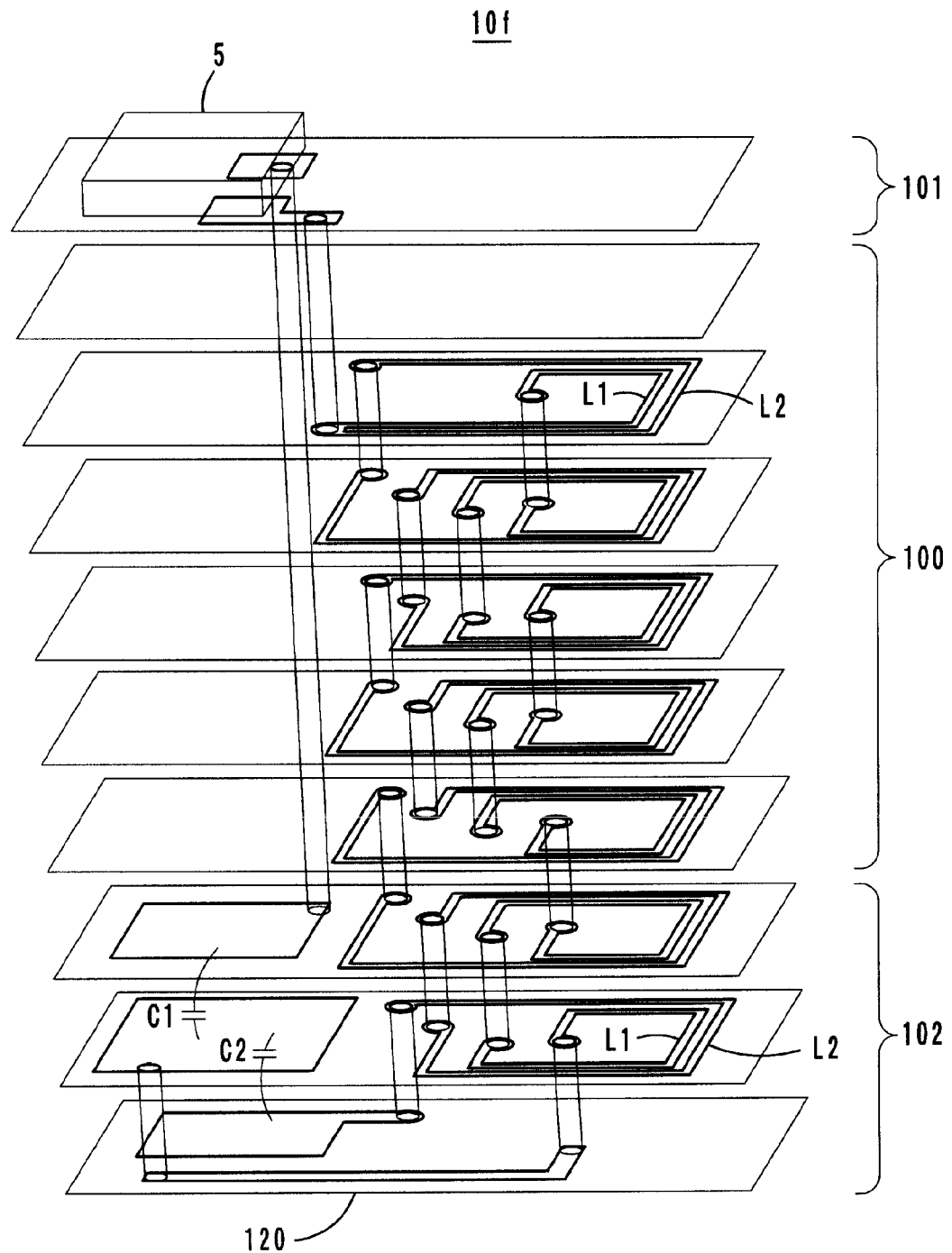
FIG. 16 is an exploded perspective view of a wireless IC device according to a fifth preferred embodiment of the present invention.

As shown in FIGS. 16 and 18, in a wireless IC device 1f according to a fifth preferred embodiment of the present invention, a feed circuit board 10f includes the wireless IC chip 5 disposed on a first main surface 110. The feed circuit board 10f has a multilayer structure in which non-magnetic layers 101 and 102 made of a low-permeability magnetic ceramic material or a non-magnetic ceramic material are layered on opposed sides of the high-permeability magnetic layers 100 made of a high-permeability magnetic ceramic material. The structure of the capacitance elements C1 and C2 and the inductance elements L1 and L2 and the equivalent circuit thereof in the feed circuit board 10f are similar to those in the third preferred embodiment. The radiation plate 20 is provided at a desired location on the second main surface 120 of the feed circuit board 10f, as shown in FIG. 17.

In the feed circuit board 10f, the second-main-surface-side winding portion, among the inductor conductive patterns defining the inductance elements L1 and L2, is provided in the non-magnetic layers 102. Although the non-magnetic layer 101 is provided at the side of the first main surface 110, no inductor conductive pattern is provided in the non-magnetic layer 101. Accordingly, the magnetic flux generated by the inductor conductive patterns is reflected from the side of the non-magnetic layer 101 due to the difference in the permeability and efficiently propagates to the radiation plate 20 via the non-magnetic layers 102 so as to increase the gain. In other words, such a structure provides directivity (i.e., the directivity to the second main surface) to the magnetic flux. In addition, since the capacitance elements C1 and C2 are provided in the non-magnetic layers 102, it is possible to provide capacitance elements having increased capacitances if the layers have an increased permittivity.

Sixth Preferred Embodiment

Figure 19:
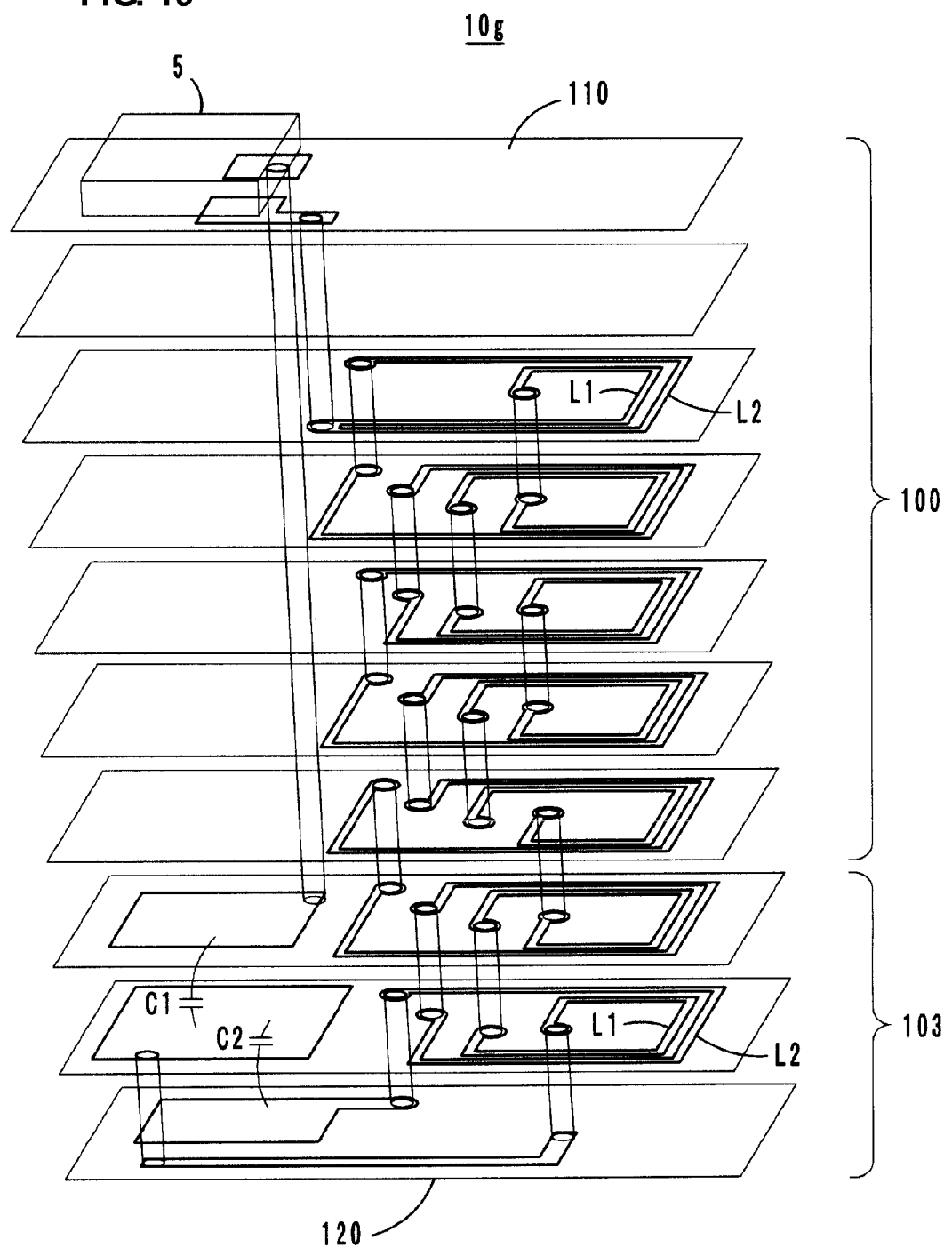
FIG. 19 is an exploded perspective view of a wireless IC device (a wireless IC device composite component) according to a sixth preferred embodiment of the present invention.
Figure 20:
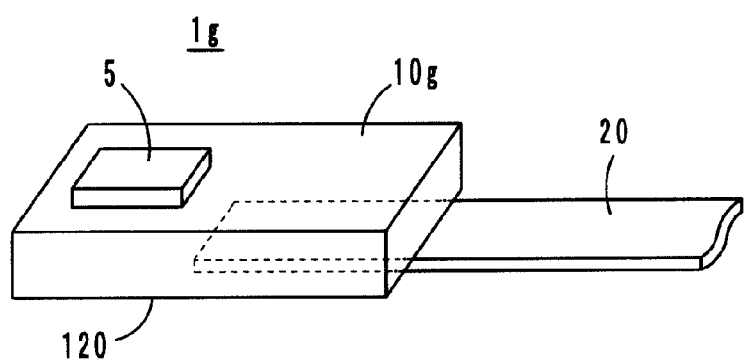
FIG. 20 is an external perspective view of the wireless IC device according to the sixth preferred embodiment of the present invention.

As shown in FIG. 19, in a wireless IC device 1g according to a sixth preferred embodiment of the present invention, a feed circuit board 10g includes the wireless IC chip 5 on a first main surface 110. The feed circuit board 10g has a multilayer structure in which non-magnetic layers 103 made of a low-permeability magnetic ceramic material or a non-magnetic ceramic material are layered on one side of the high-permeability magnetic layers 100 made of a high-permeability magnetic ceramic material. The structure of the capacitance elements C1 and C2 and the inductance elements L1 and L2 and the equivalent circuit thereof in the feed circuit board 10g are similar to those in the third preferred embodiment. The radiation plate 20 is provided at a desired location on the second main surface 120 of the feed circuit board 10g, as shown in FIG. 20.

In the feed circuit board 10g, the second-main-surface-side winding portion, among the inductor conductive patterns defining the inductance elements L1 and L2, is provided in the non-magnetic layers 103. Accordingly, the magnetic flux generated by the inductor conductive patterns efficiently propagates to the radiation plate 20 via the non-magnetic layers 103 at the side of the second main surface 120 so as to increase the gain. The magnetic flux generated by the inductor conductive patterns is trapped in the high-permeability magnetic layers 100 at the side of the first main surface 110. In other words, such a structure provides directivity (i.e., the directivity to the second main surface) to the magnetic flux. In addition, since the majority of the inductor conductive patterns are provided in the high-permeability magnetic layers 100, the Q value of the inductance elements is increased. Accordingly, even if the size of the inductance elements is reduced, the inductance elements having sufficient inductances are provided to achieve stable frequency characteristics. Furthermore, since the capacitance elements C1 and C2 are provided in the non-magnetic layers 103, it is possible to provide capacitance elements having increased capacitances if the layers have an increased permittivity.

Seventh Preferred Embodiment

Figure 21:
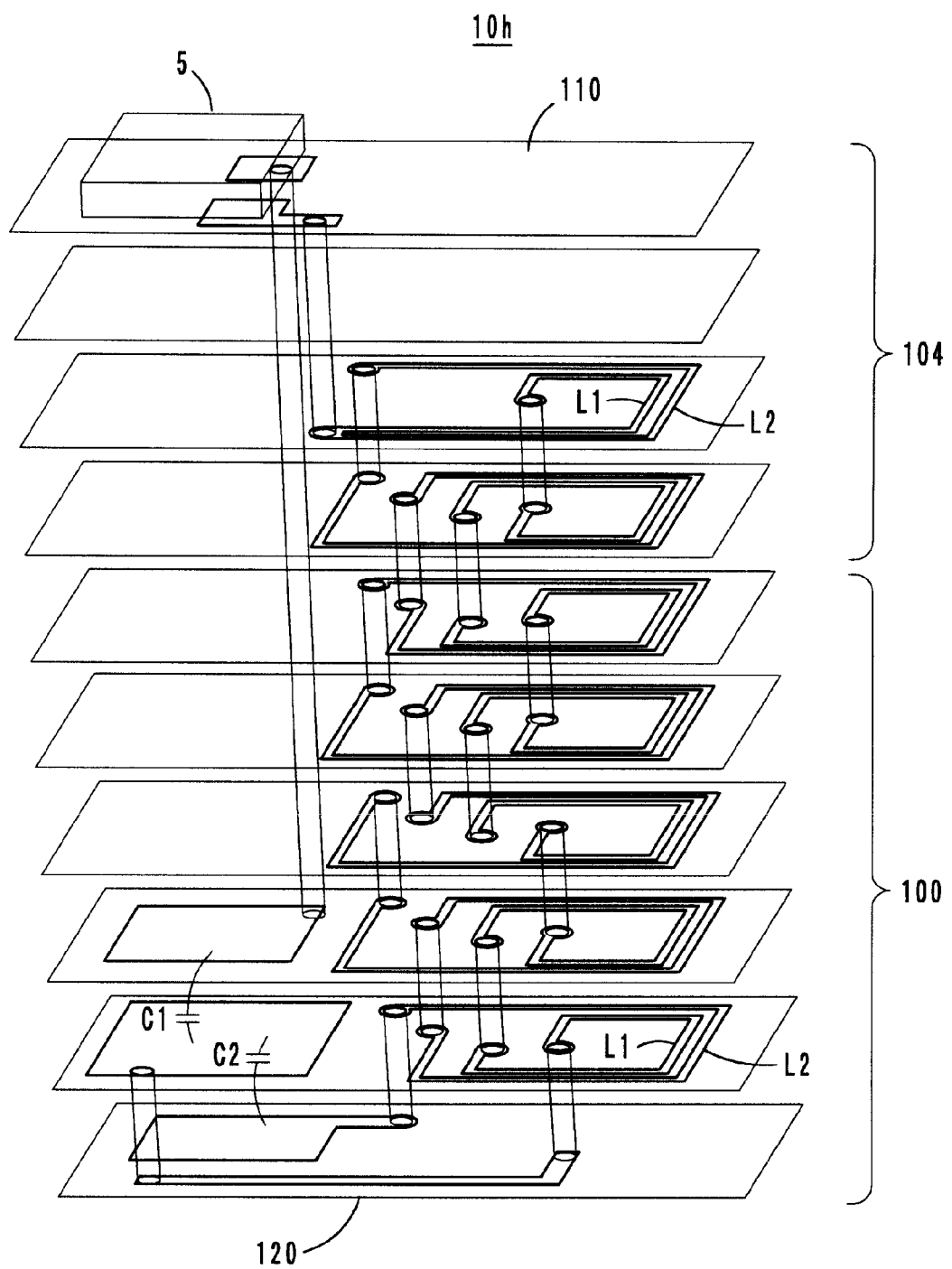
FIG. 21 is an exploded perspective view of a wireless IC device according to a seventh preferred embodiment of the present invention.
Figure 22:
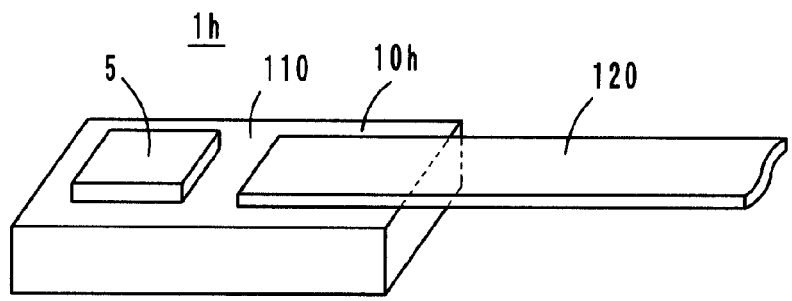
FIG. 22 is an external perspective view of the wireless IC device according to the seventh preferred embodiment of the present invention.

As shown in FIG. 21, in a wireless IC device 1h according to a seventh preferred embodiment of the present invention, a feed circuit board 10h includes the wireless IC chip 5 on a first main surface 110. The feed circuit board 10h has a multilayer structure in which non-magnetic layers 104 made of a low-permeability magnetic ceramic material or a non-magnetic ceramic material are layered on a side of the high-permeability magnetic layers 100 made of a high-permeability magnetic ceramic material. The structure of the capacitance elements C1 and C2 and the inductance elements L1 and L2 and the equivalent circuit thereof in the feed circuit board 10h are similar to those in the third preferred embodiment. The radiation plate 20 is provided at a desired location on the first main surface 110 of the feed circuit board 10h, as shown in FIG. 22.

In the feed circuit board 10h, the first-main-surface-side winding portion, among the inductor conductive patterns defining the inductance elements L1 and L2, is provided in the non-magnetic layers 104. Accordingly, the magnetic flux generated by the inductor conductive patterns efficiently propagates to the radiation plate 20 via the non-magnetic layers 104 at the side of the first main surface 110 to increase the gain. The magnetic flux generated by the inductor conductive patterns is trapped in the high-permeability magnetic layers 100 at the side of the second main surface 120. In other words, such a structure provides directivity (i.e., the directivity to the first main surface) to the magnetic flux.

Eighth Preferred Embodiment

Figure 23:
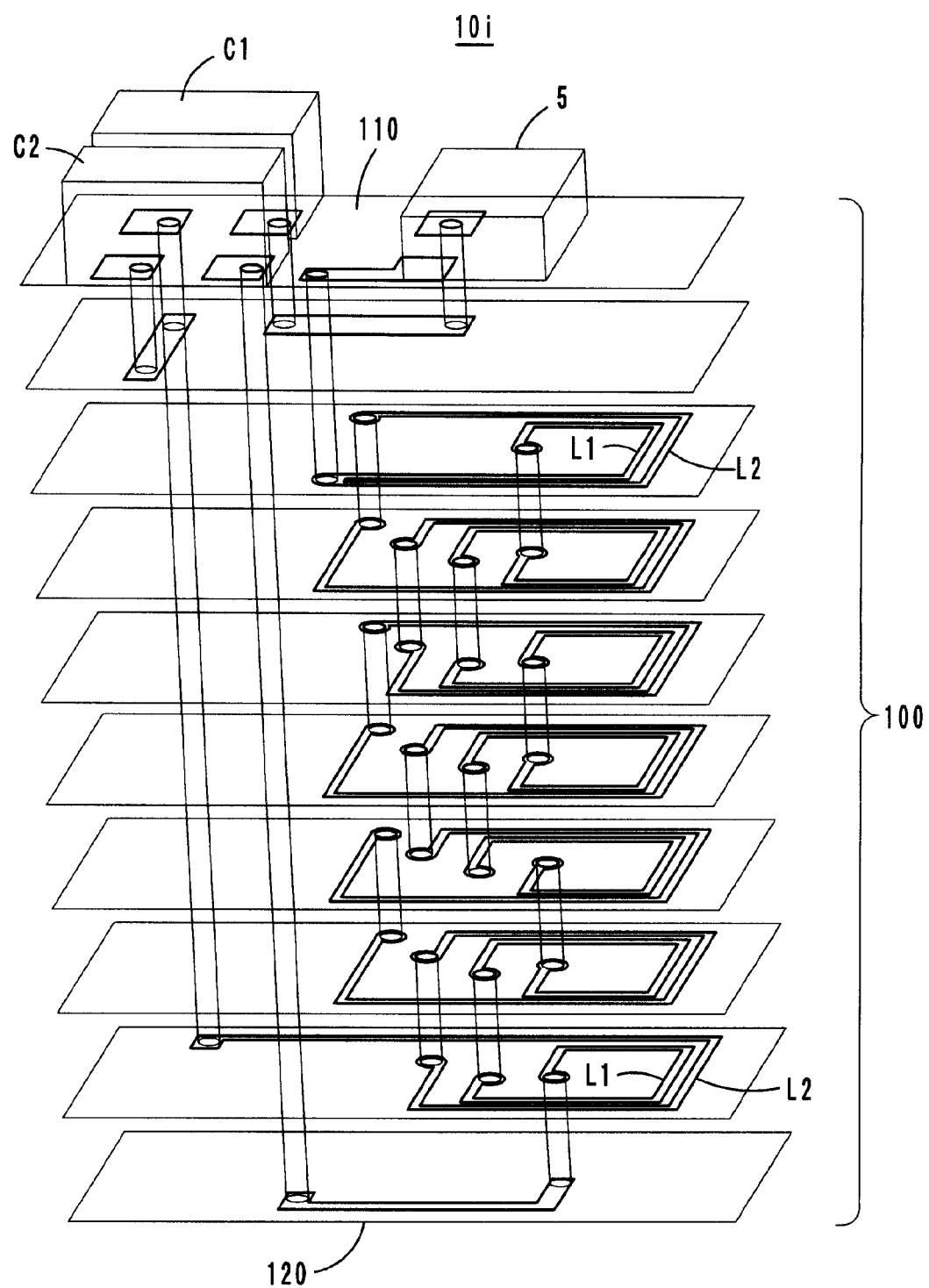
FIG. 23 is an exploded perspective view of a wireless IC device according to an eighth preferred embodiment of the present invention.

As shown in FIG. 23, in a wireless IC device 1i according to an eighth preferred embodiment of the present invention, a feed circuit board 10i includes the wireless IC chip 5 on a first main surface 110. The feed circuit board 10i has a multilayer structure in which multiple high-permeability magnetic layers 100 made of a high-permeability magnetic ceramic material are layered. The equivalent circuit including the capacitance elements C1 and C2 and the inductance elements L1 and L2 in the feed circuit board 10i is similar to that in the third preferred embodiment. The radiation plate, although not shown, can be provided at any suitable arbitrary location on the first main surface, the second main surface, or the side surface, as in the third preferred embodiment.

Figure 24:
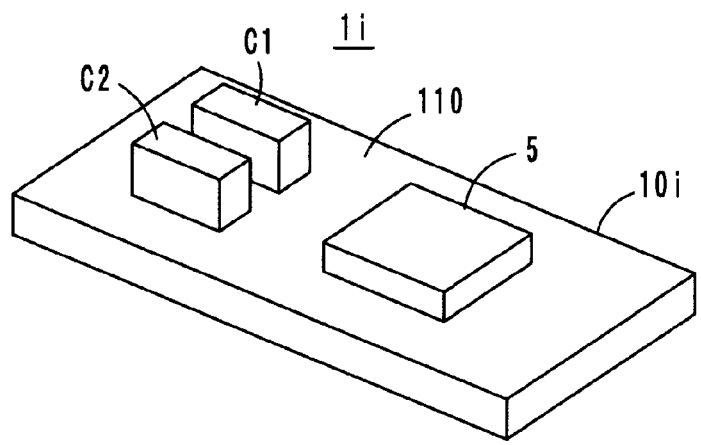
FIG. 24 is an external perspective view of the wireless IC device (the wireless IC device composite component) according to the eighth preferred embodiment of the present invention.

As shown in FIGS. 23 and 24, the capacitance elements C1 and C2 are defined by a surface mount device including chip ceramic capacitors in the feed circuit board 10i. Defining the capacitance elements as the surface mount device enables the degree of freedom of the selection of capacitances to be increased, so as to be suitable for situations in which greater capacitances are required.

Figure 25:
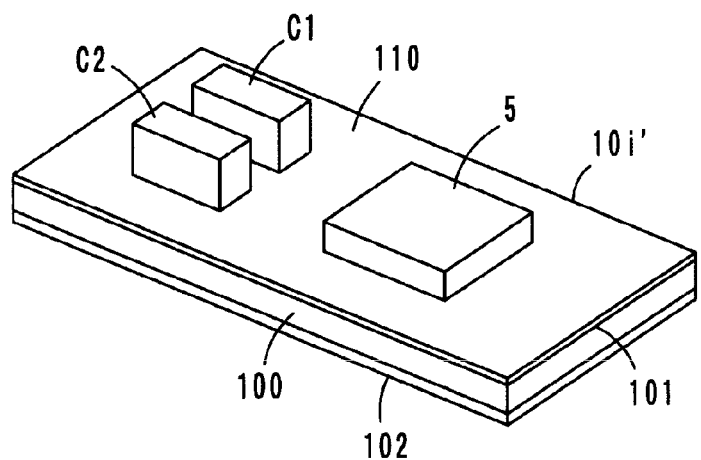
FIG. 25 is an external perspective view of a modification of the wireless IC device according to the eighth preferred embodiment of the present invention.

In addition, even when the capacitance elements are defined by the surface mount device, it is possible to apply a feed circuit board having a multilayer structure in which the high-permeability magnetic layers 100 and the non-magnetic layers 101 and 102 are layered, as in a feed circuit board 10i' shown in FIG. 25.

Ninth Preferred Embodiment

In a wireless IC device 1j according to a ninth preferred embodiment of the present invention, as shown in FIG. 26, a radiation plate 22 having a dual closed-loop shape is symmetrically provided on the surface of the resin film 21 and a feed circuit board 10j on which the wireless IC chip 5 is mounted is arranged at a central portion of the inner loop of the radiation plate 22. Any of the feed circuit boards 10a to 10h described above can be used as the feed circuit board 10j.

In the ninth preferred embodiment, the feed circuit board 10j is not adhered to the radiation plate 22, and instead, is arranged adjacent to the radiation plate 22. Since the radiation plate 22 has a loop shape, the linear length of the radiation plate 22 is decreased. Even with this structure, the feed circuit board 10j is magnetically coupled to the radiation plate 22, so that signals can be exchanged in substantially the same manner as in the above-described preferred embodiments and effective communication with a reader-writer can be established. It is sufficient for the feed circuit board 10j to be arranged at the substantially central portion of the radiation plate 22 and to have reduced positional accuracy.

Tenth Preferred Embodiment

In a wireless IC device 1k according to a tenth preferred embodiment, as shown in FIG. 27, a radiation plate 23 having a shape defined by a combination of meandering, loop, and spiral patterns is symmetrically provided on the surface of the resin film 21 and a feed circuit board 10k on which the wireless IC chip 5 is mounted is arranged at the central portion of the inner loop of the radiation plate 23. Any of the feed circuit boards 10a to 10h described above can be used as the feed circuit board 10k.

Also in the tenth preferred embodiment, the feed circuit board 10k is not adhered to the radiation plate 23 and is arranged adjacent to the radiation plate 23. Since the radiation plate 23 has a shape defined by a combination of meandering, loop, and spiral patterns, the linear length of the radiation plate 23 is decreased. Even with this structure, the feed circuit board 10k is magnetically coupled to the radiation plate 23, so that signals can be exchanged in substantially the same manner as in the above-described preferred embodiments and effective communication with a reader-writer can be established. As in the ninth preferred embodiment, it is sufficient for the feed circuit board 10k to be arranged with reduced positional accuracy.

First Preferred Application

Figure 28:
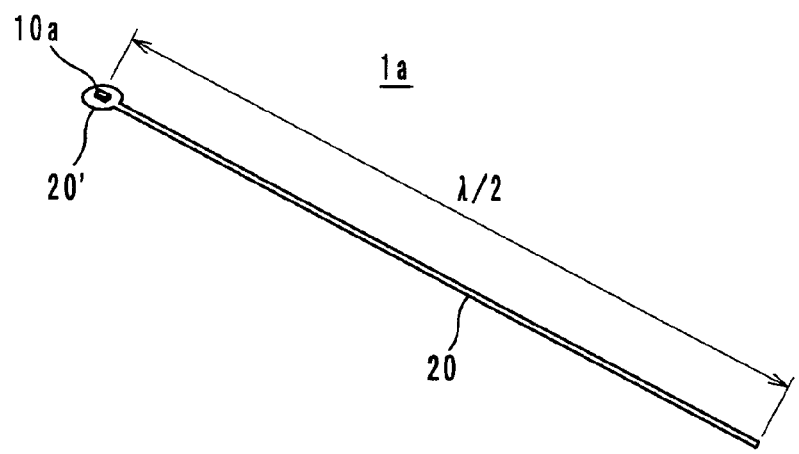
FIG. 28 is an external perspective view of a wireless IC device according to a first preferred application of the present invention.

In a first preferred application of the wireless IC device 1a, as shown in FIG. 28, the radiation plate 20 preferably has an elongated shape and the area of a portion 20' in which the feed circuit board 10a is adhered to the radiation plate 20 is preferably greater than that of the board 10a. Such a structure does not require strict positional accuracy when the feed circuit board 10a is adhered to the radiation plate 20 and stable electrical characteristics are achieved. The remaining structure of the wireless IC device 1a, that is, the internal structure of the feed circuit board 10a is the same as in the first preferred embodiment.

Second Preferred Application

Figure 29:
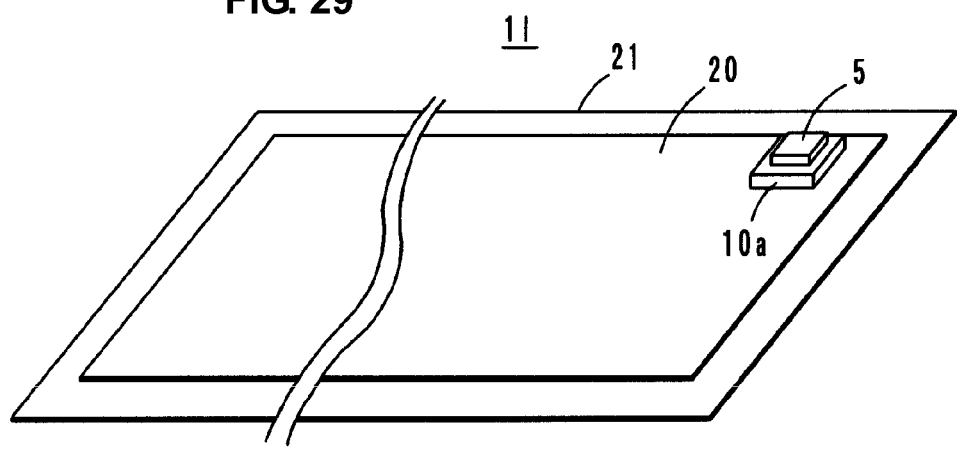
FIG. 29 is an external perspective view of a wireless IC device according to a second preferred application of the present invention.

In a wireless IC device 1l according to a second preferred application, as shown in FIG. 29, the large radiation plate 20 preferably made of, for example, an aluminum foil is provided on the relatively large flexible insulative resin film 21. The feed circuit board 10a on which the wireless IC chip 5 is mounted is adhered to an arbitrary location on the radiation plate 20.

The remaining structure of the wireless IC device 1l, that is, the internal structure of the feed circuit board 10a is the same as in the first preferred embodiment. Accordingly, the effects and advantages of the second preferred application are similar to those of the first preferred embodiment. In addition, the second preferred application has an advantage in that it is sufficient for the feed circuit board 10a to be adhered with a reduced positional accuracy.

Third Preferred Application

Figure 30:
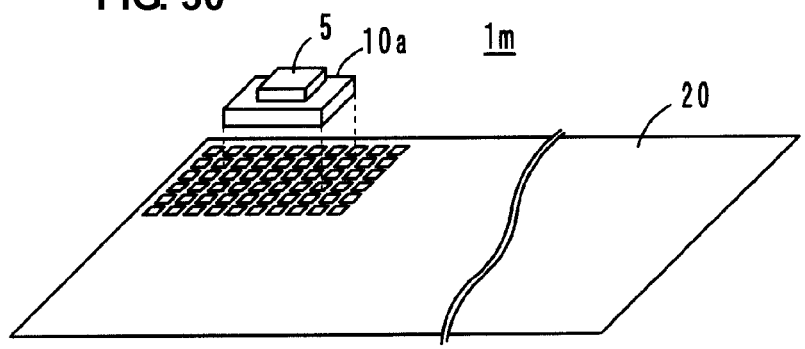
FIG. 30 is an external perspective view of a wireless IC device according to a third preferred application of the present invention.

In a wireless IC device 1m according to a third preferred application, as shown in FIG. 30, the large radiation plate 20 preferably made of, for example, an aluminum foil is subjected to mesh division. The mesh may be formed on the entire radiation plate 20 or may be formed on only a portion of the radiation plate 20.

The remaining structure of the wireless IC device 1m is substantially the same as in the first preferred embodiment. Since the magnetic flux of the coil electrode pattern escapes from the openings in the mesh, in addition to the advantage that it is sufficient for the feed circuit board 10a to be adhered with a reduced positional accuracy, the variation of the magnetic flux generated from the feed circuit board 10a is reduced and, therefore, a greater amount of the magnetic flux passes thorough the radiation plate 20. Consequently, it is possible to improve the transmission efficiency of the signal energy and to reduce the shift in frequency due to the adherence.

Fourth Preferred Application

Figure 31:
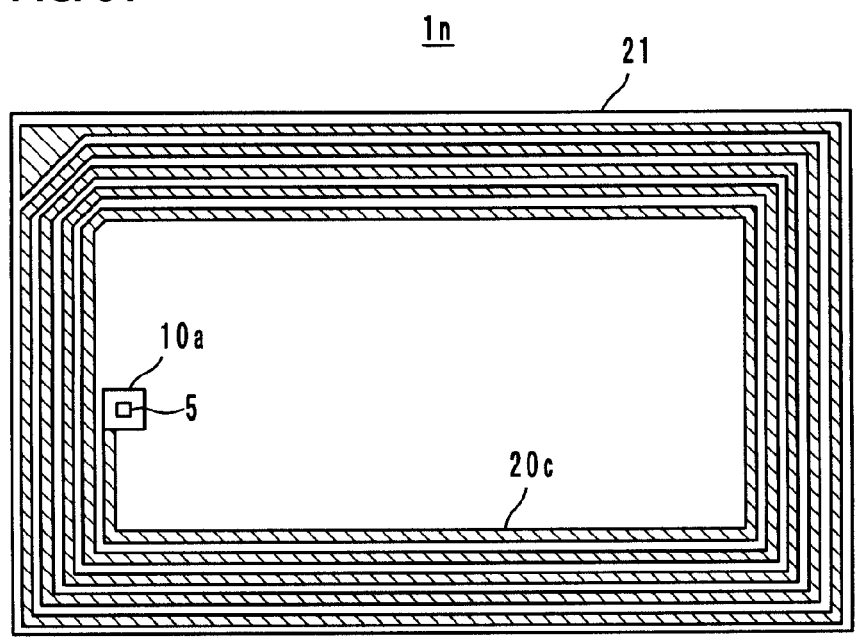
FIG. 31 is a plan view of a wireless IC device according to a fourth preferred application of the present invention.
Figure 32:
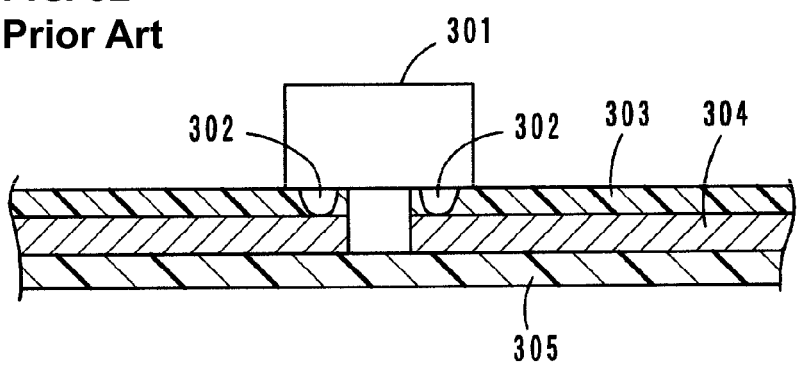
FIG. 32 is a schematic cross-sectional view showing an example of a wireless IC device in related art.

In a wireless IC device in according to a fourth preferred application, as shown in FIG. 31, a radiation plate 20c is wound in a substantially spiral shape. The radiation plate may preferably have a substantially spiral shape in the preferred embodiments of the present invention. In this case, the increase in the inductance of the radiation plate can be used to increase the gain in a relatively small area.

As described above, preferred embodiments of the present invention are useful for a wireless IC device and, particularly, provide stable frequency characteristics.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wireless IC device comprising:
a wireless IC chip;
a feed circuit board connected to the wireless IC chip and including a feed circuit including an inductance element that includes a first portion and a second portion; and
a radiation plate electromagnetically coupled to the inductance element in the feed circuit; wherein
the radiation plate and the inductance element are not directly physically or electrically connected to one another;
a high-permeability magnetic body made of a high-permeability magnetic material is provided in at least a portion of the feed circuit board and the first portion of the inductance element is provided in the high-permeability magnetic body;
the second portion of the inductance element is provided outside of the high-permeability magnetic body and is electromagnetically coupled to the radiation plate; and
the radiation plate is arranged to radiate a transmission signal supplied from the feed circuit board and/or receive a reception signal and supply the reception signal to the feed circuit board.

2. The wireless IC device according to claim 1, wherein
the inductance element includes a coil inductor pattern; and
the coil inductor pattern is arranged on the feed circuit board such that a winding axis of the coil inductor pattern is substantially perpendicular to the radiation plate.

3. The wireless IC device according to claim 2, wherein
a non-magnetic body made of at least one of a low-permeability magnetic material and a non-magnetic material is provided in the feed circuit board; and
a winding portion adjacent to the radiation plate, in the coil inductor pattern, is provided in the non-magnetic body.

4. The wireless IC device according to claim 1, wherein
the inductance element includes a coil inductor pattern; and
the coil inductor pattern is provided on the feed circuit board such that a winding axis of the coil inductor pattern is substantially parallel to the radiation plate.

5. The wireless IC device according to claim 1, wherein the feed circuit includes the inductance element and a capacitance element that are arranged to define an LC resonant circuit having a predetermined resonant frequency.

6. The wireless IC device according to claim 5, wherein the feed circuit includes a plurality of LC resonant circuits.

7. The wireless IC device according to claim 5, wherein the capacitance element is included in the feed circuit board as a capacitor pattern.

8. The wireless IC device according to claim 5, wherein the capacitance element is mounted on the feed circuit board as a surface mount device.

9. The wireless IC device according to claim 5, wherein the capacitance element is located downstream of the wireless IC chip and is arranged between the wireless IC chip and the inductance element.

10. The wireless IC device according to claim 7, wherein the inductance element includes an inductor pattern, and the capacitor pattern and the inductor pattern are arranged substantially in parallel to and adjacent to the radiation plate.

11. The wireless IC device according to claim 1, wherein the radiation plate is made of a magnetic metal material.

12. The wireless IC device according to claim 1, wherein the feed circuit board is a ceramic multilayer board in which a plurality of ceramic layers are layered.

13. The wireless IC device according to claim 1, wherein the feed circuit board is a rigid board and the radiation plate is defined by a flexible metal film.

14. The wireless IC device according to claim 13, wherein the flexible metal film is disposed on a flexible resin film.

15. The wireless IC device according to claim 1, wherein the electrical length of the radiation plate is an integer multiple of a half-wavelength of the resonant frequency.

* * * * *